(12) United States Patent
Lee et al.

(10) Patent No.: US 12,199,015 B2
(45) Date of Patent: Jan. 14, 2025

(54) SEMICONDUCTOR DEVICE INCLUDING VIA STRUCTURE AND METHOD FOR MANUFACTURING THE SAME

(71) Applicant: Samsung Electronics Co., Ltd., Suwon-si (KR)

(72) Inventors: Yeonjin Lee, Suwon-si (KR); Jongmin Lee, Suwon-si (KR); Jeonil Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 280 days.

(21) Appl. No.: 17/574,902

(22) Filed: Jan. 13, 2022

(65) Prior Publication Data
US 2023/0005818 A1  Jan. 5, 2023

(30) Foreign Application Priority Data
Jul. 5, 2021  (KR) ........................ 10-2021-0087703

(51) Int. Cl.
| | | |
|---|---|---|
| H01L 21/00 | (2006.01) | |
| H01L 21/768 | (2006.01) | |
| H01L 23/48 | (2006.01) | |
| H01L 25/065 | (2023.01) | |
| H10B 99/00 | (2023.01) | |
| H01L 23/00 | (2006.01) | |

(52) U.S. Cl.
CPC ...... *H01L 23/481* (2013.01); *H01L 21/76898* (2013.01); *H01L 25/0657* (2013.01); *H10B 99/22* (2023.02); *H01L 24/02* (2013.01); *H01L 24/05* (2013.01); *H01L 24/06* (2013.01); *H01L 24/13* (2013.01); *H01L 2224/0221* (2013.01); *H01L 2224/02372* (2013.01); *H01L 2224/05569* (2013.01); *H01L 2224/0557* (2013.01); *H01L 2224/05573* (2013.01); *H01L 2224/06181* (2013.01); *H01L 2224/13007* (2013.01); *H01L 2225/06513* (2013.01); *H01L 2225/06517* (2013.01); *H01L 2225/06544* (2013.01)

(58) Field of Classification Search
CPC ............ H01L 23/481; H01L 21/76898; H01L 25/0657
See application file for complete search history.

(56) References Cited

U.S. PATENT DOCUMENTS

| | | |
|---|---|---|
| 8,264,065 B2 | 9/2012 | Su et al. |
| 8,354,736 B2 | 1/2013 | Moroz |
| 8,604,619 B2 | 12/2013 | Hsieh et al. |
| 8,962,474 B2 | 2/2015 | Yu et al. |

(Continued)

FOREIGN PATENT DOCUMENTS

KR  10-2014-0034602 A  3/2014

*Primary Examiner* — Laura M Menz
(74) *Attorney, Agent, or Firm* — HARNESS, DICKEY & PIERCE, P.L.C.

(57) ABSTRACT

A semiconductor device according to some example embodiments includes a substrate, an insulating structure covering the substrate, a transistor between the substrate and the insulating structure, a via insulating layer extending through the insulating structure and the substrate, a plurality of via structures extending through the via insulating layer, a plurality of conductive structures respectively connected to the plurality of via structures, and a plurality of bumps respectively connected to the conductive structures.

5 Claims, 31 Drawing Sheets

(56) References Cited

U.S. PATENT DOCUMENTS

| | | |
|---|---|---|
| 9,214,374 B2 | 12/2015 | Lee et al. |
| 2014/0070426 A1 | 3/2014 | Park et al. |
| 2016/0020145 A1* | 1/2016 | Lee .................... H01L 21/31053 |
| | | 438/618 |
| 2016/0086874 A1* | 3/2016 | Choi ....................... H01L 24/03 |
| | | 257/774 |
| 2017/0062308 A1* | 3/2017 | Choi ................... H01L 23/5329 |
| 2017/0125364 A1 | 5/2017 | Cho et al. |
| 2018/0315620 A1* | 11/2018 | Lee ......................... H01L 24/02 |
| 2021/0020544 A1* | 1/2021 | Park ...................... H01L 21/486 |
| 2022/0020667 A1* | 1/2022 | Park .................. H01L 21/76898 |
| 2022/0223557 A1* | 7/2022 | Chen ................. H01L 21/76898 |
| 2022/0310580 A1* | 9/2022 | Chiu ...................... H01L 23/481 |
| 2022/0367320 A1* | 11/2022 | Lee ........................ H01L 23/481 |
| 2023/0005818 A1* | 1/2023 | Lee ........................ H01L 27/105 |
| 2023/0077803 A1* | 3/2023 | Choi ..................... H01L 25/0657 |
| | | 257/774 |
| 2023/0178487 A1* | 6/2023 | Hwang ............... H01L 23/5329 |
| | | 257/750 |
| 2023/0180475 A1* | 6/2023 | Choi ....................... H10B 41/10 |
| | | 438/478 |
| 2023/0260828 A1* | 8/2023 | Kim .................. H01L 21/76229 |
| | | 438/259 |
| 2023/0354583 A1* | 11/2023 | Zhang .................. H10B 12/482 |
| 2023/0361004 A1* | 11/2023 | Hwang ................. H01L 23/528 |
| 2024/0030118 A1* | 1/2024 | Kang ....................... H01L 23/15 |

* cited by examiner

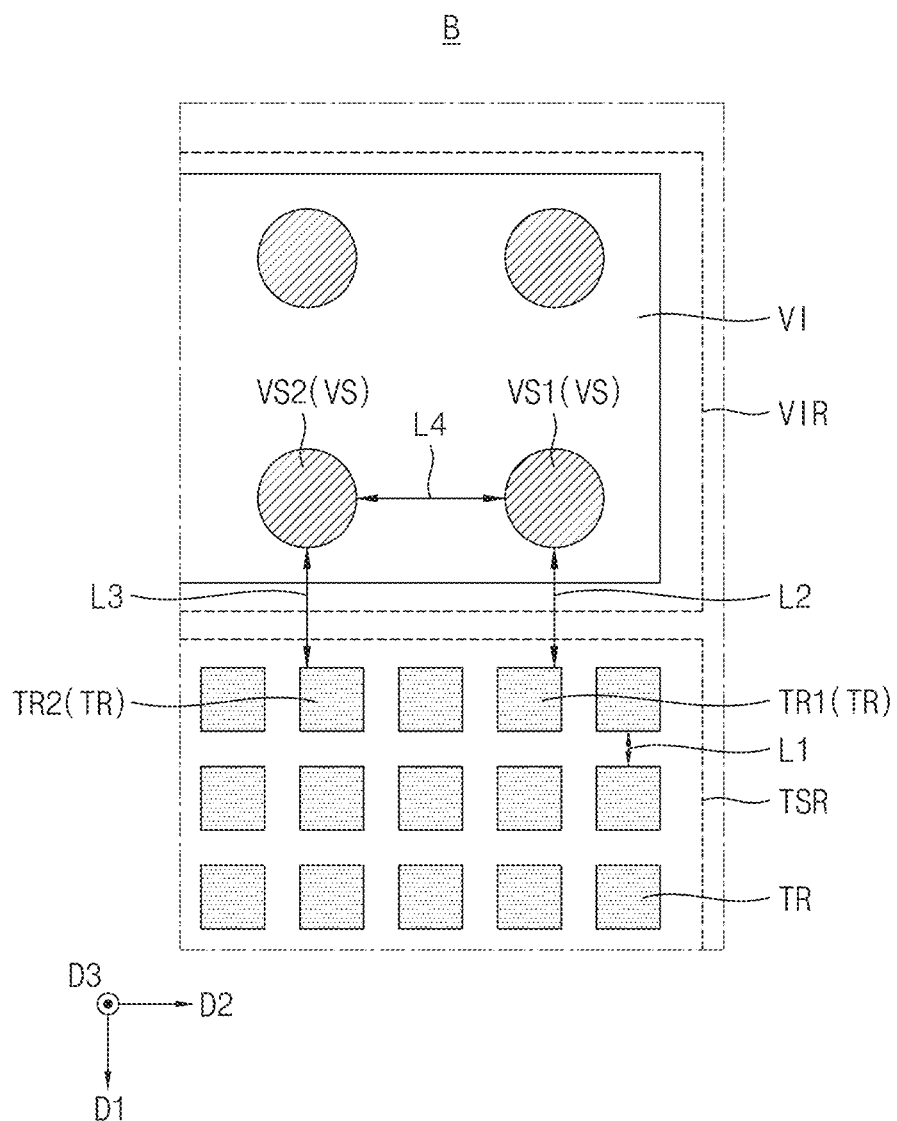

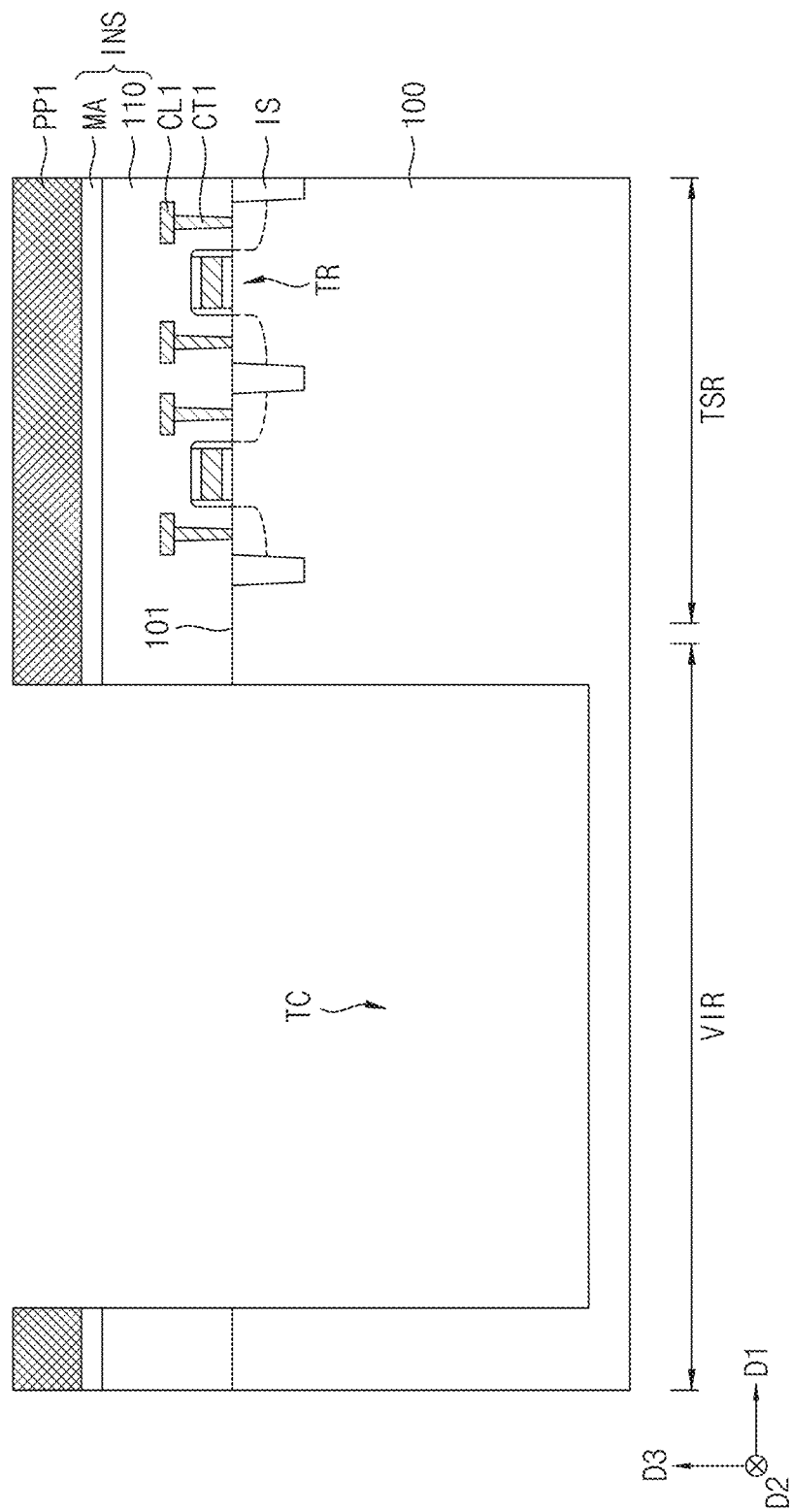

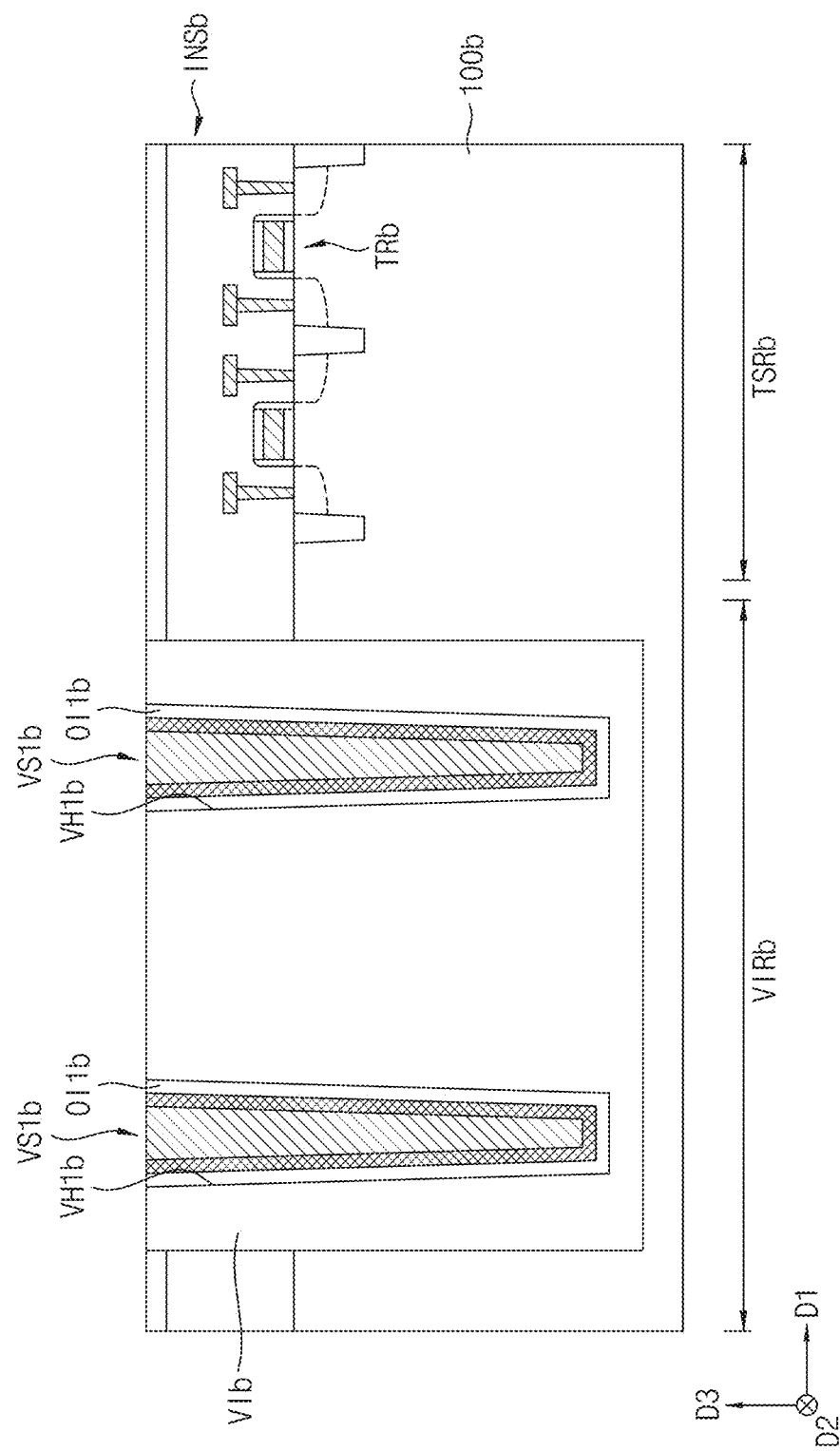

SEMICONDUCTOR DEVICE INCLUDING VIA STRUCTURE AND METHOD FOR MANUFACTURING THE SAME

CROSS-REFERENCE TO THE RELATED APPLICATION

This application claims priority from Korean Patent Application No. 10-2021-0087703, filed on Jul. 5, 2021, in the Korean Intellectual Property Office, the disclosure of which is incorporated herein by reference in its entirety.

BACKGROUND

Some example embodiments relate to a semiconductor device and a method for manufacturing the same. In particular, some example embodiments relate to a semiconductor device including a via structure and/or a method for manufacturing the same.

Semiconductor devices are being highlighted as an important element in electronics industries in accordance with characteristics thereof such as one or more of miniaturization, multifunctionality, low manufacturing costs, etc. Semiconductor devices may be classified into a semiconductor memory device to store logic data, a semiconductor logic device to arithmetically process logic data, a hybrid semiconductor device including a memory element and a logic element, etc. In accordance with advances in electronics industries, demand/desire for characteristics of semiconductor devices is gradually increasing. For example, demand or desire for one or more of high reliability, high speed, multifunctionality, etc. of semiconductor devices is gradually increasing. In order to satisfy such demanded characteristics, structures in semiconductor devices become more and more complicated. In addition, semiconductor devices become more and more highly integrated.

SUMMARY

Example embodiments of inventive concepts provide a semiconductor device having a relatively small size.

A semiconductor device according to some example embodiments includes a substrate, an insulating structure covering the substrate, a transistor between the substrate and the insulating structure, a via insulating layer extending through the insulating structure and the substrate, a plurality of via structures extending through the via insulating layer, a plurality of conductive structures respectively connected to the plurality of via structures, and a plurality of bumps respectively connected to the conductive structures.

A semiconductor device according to some example embodiments includes a substrate, an insulating structure covering a first surface of the substrate, transistors on the first surface of the substrate, a via insulating layer extending through the substrate and the insulating structure, and a plurality of first via structures surrounded by the via insulating layer.

A semiconductor device according to some example embodiments includes a substrate, an insulating structure covering the substrate, first transistors in a transistor region between the substrate and the insulting structure, and first via structures in via regions and extending through the substrate and the insulating structure. The first transistors are apart from the via regions. The transistor region is between the via regions.

A method for fabricating a semiconductor device in accordance with some example embodiments includes forming a transistor on a substrate, forming an insulating structure covering the transistor, forming a trench by etching the insulating structure and the substrate, forming a via insulating layer in the trench, forming a via hole in the via insulating layer, and forming a via structure in the via hole.

BRIEF DESCRIPTION OF THE DRAWINGS

FIGS. 2A, 2B, 2C, 2D, 2E, 2F, 2G, 2H, and 2I are cross-sectional views explaining a method for manufacturing the semiconductor device according to FIGS. 1A, 1B and 1C.

FIGS. 5A, 5B, 5C, 5D, 5E, and 5F are cross-sectional views explaining a method for manufacturing the semiconductor device according to FIGS. 4A, 4B, and 4C.

DETAILED DESCRIPTION OF SOME EXAMPLE EMBODIMENTS

Figure 1A:
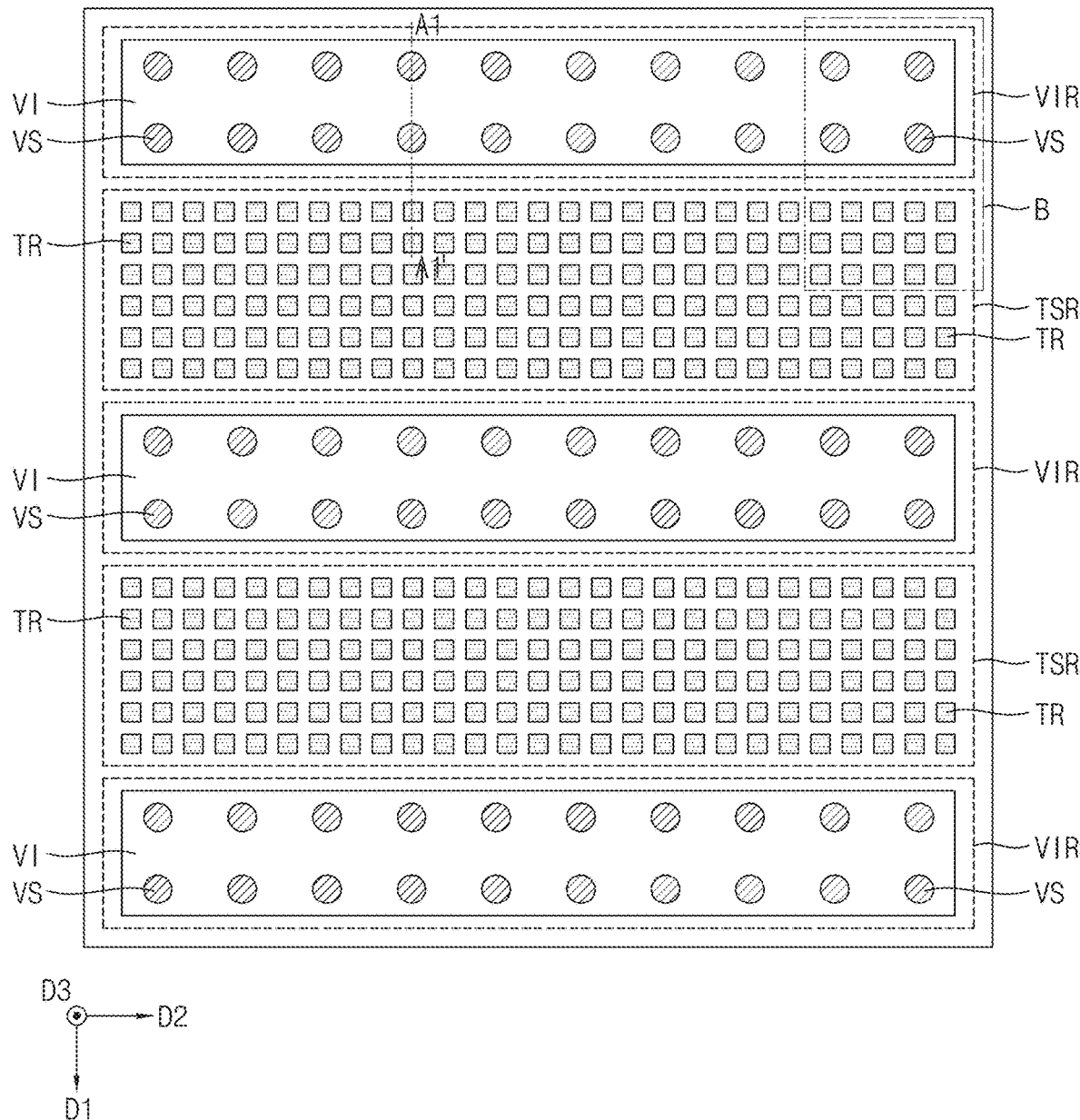
FIG. 1 is a plan view of a semiconductor device according to some example embodiments of the disclosure.
FIG. 1B is a cross-sectional view taken along line A1-A1' in FIG. 1A.
FIG. 1C is an enlarged view of a portion B of FIG. 1A.
Figure 1B:
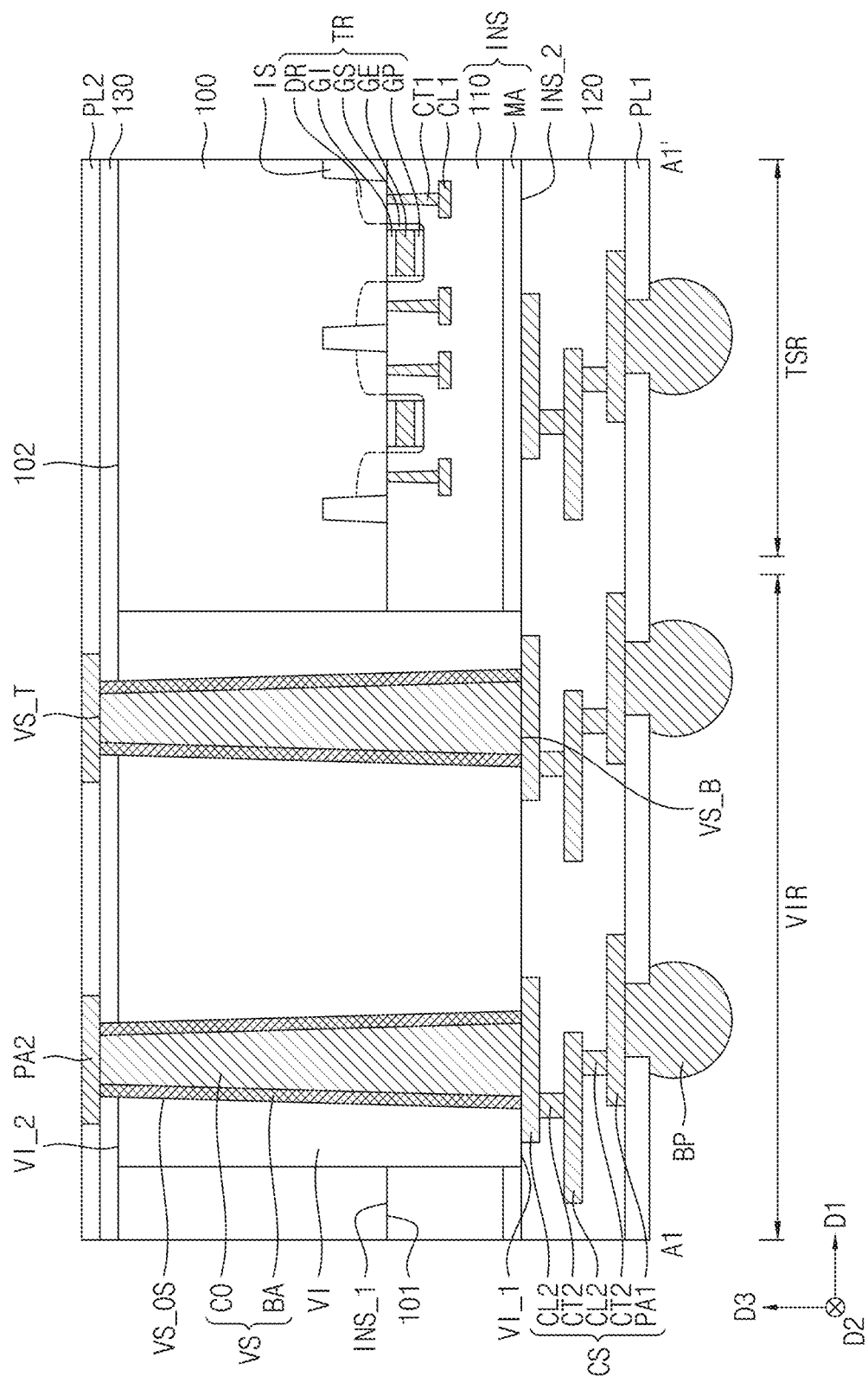

FIG. 1 is a plan view of a semiconductor device according to some example embodiments of the disclosure. FIG. 1B is a cross-sectional view taken along line A1-A1' in FIG. 1A. FIG. 1C is an enlarged view of a portion B of FIG. 1A.

Referring to FIGS. 1A and 1B, the semiconductor device may include a substrate 100. The substrate 100 may have the form of a plate extending along a plane defined by a first direction D1 and a second direction D2. The first direction D1 and the second direction D2 may intersect each other. For example, the first direction D1 and the second direction D2 may perpendicularly intersect each other. In some example embodiments, the substrate 100 may be a semiconductor substrate such as a single crystal substrate. For example, the substrate 100 may include silicon, germanium, silicon-germanium, GaP, or GaAs, and may be doped or undoped.

The semiconductor device may include via regions VIR and transistor regions TSR. The via regions VIR and the transistor regions TSR may be distinct from one another. The via regions VIR and the transistor regions TSR may be regions divided from one another on a plane defined by the first direction D1 and the second direction D2. The via regions VIR and the transistor regions TSR may extend in the second direction D2; however, example embodiments are not limited thereto. The via regions VIR and the transistor regions TSR may be alternately arranged in the first direction D1. The transistor region TSR may be disposed among the via regions VIR.

An insulating structure INS covering a first surface 101 of the substrate 100 may be provided. A first surface INS_1 of the insulating structure INS may contact (e.g., directly contact) the first surface 101 of the substrate 100. When viewed in a viewpoint according to FIG. 1B, the first surface 101 of the substrate 100 may be a bottom surface of the substrate 100, and the first surface INS_1 of the insulating structure INS may be a top surface of the insulating structure INS. The first surface 101 of the substrate 100 may be or correspond to an active surface of the substrate 100. The substrate 100 may be provided on the insulating structure INS. The insulating structure INS may include a first insulating layer 110 covering the first surface 101 of the substrate 100, and a mask layer MA covering a bottom surface of the first insulating layer 110. In some example embodiments, each of the first insulating layer 110 and the mask layer MA may be multiple layers. The first insulating layer 110 and the mask layer MA may include an insulating material. In some example embodiments, the insulating structure INS may not include the mask layer MA, and may be constituted or correspond to by the first insulating layer 110 alone, differently from the shown case.

Transistors TR may be provided between the insulating structure INS and the substrate 100. The transistors TR may be planar transistors; however, example embodiments are not limited thereto. The transistors TR may be NFET transistors or PFET transistors; however, example embodiments are not limited thereto. For example, the transistor TR may be a cell transistor and/or a peripheral transistor constituting or included in a memory device, a logic device or an image sensor device. The transistors TR may be disposed only in the transistor regions TSR. The transistors TR may not be disposed in the via region VIR. The transistors TR may be spaced apart from the via regions VIR. The transistors TR may be covered by the first insulating layer 110 of the insulating structure INS. The transistors TR may be disposed on the first surface 101 of the substrate 100. Although FIG. 1A illustrates that the transistors TR are arranged in a regular fashion, example embodiments are not limited thereto.

The transistors TR may include impurity regions DR, and a channel and a gate structure which are disposed between the impurity regions DR. The gate structure may include gate spacers GS, and a gate insulating film GI, a gate electrode GE and a gate capping film GP which are disposed between the gate spacers GS. The impurity regions DR may be formed as impurities are implanted in the substrate 100. The gate spacers GS, the gate insulating film GI, and the gate capping film GP may include an insulating material. The gate electrode GE may include a conductive material. The structure of the transistor TR is not limited to the structure shown and described above. In some example embodiments, the transistors TR may include a buried gate electrode. In some example embodiments, the transistors TR may include a vertical gate electrode. In some example embodiments, the transistors may include a gate-all-around (GAA) structure.

Element isolation films IS may be provided in the substrate 100. The transistors TR may be disposed among the element isolation films IS. The element isolation films IS may define an active region of the transistor TR. The element isolation films IS may include an insulating material.

First contacts CT1 and first contact lines CL1 may be provided in the first insulating layer 110 of the insulating structure INS. The first contact CT1 may be connected to the transistor TR, and the first conductive line CL1 may be connected to the first contact CT1. The first contacts CT1 and the first conductive lines CL1 may include a conductive material, such as at least one of a metal or doped polysilicon.

A second insulating layer 120 covering a second surface INS_2 of the insulating structure INS may be provided. The second surface INS_2 of the insulating structure INS may be a surface opposite to the first surface INS_1 of the insulating structure INS. When viewed in a viewpoint (e.g. in cross-section) according to FIG. 1B, the second surface INS_2 of the insulating structure INS may be a bottom surface of the insulating structure INS. The insulating structure INS may be provided on the second insulating layer 120. In some example embodiments, the second insulating layer 120 may be multiple layers. The second insulating layer 120 may include an insulating material such as at least one of silicon oxide or silicon nitride.

Conductive structures CS may be provided in the second insulating layer 120. Each of the conductive structures CS may include a second conductive line CL2, a second contact CT2, and a first pad PA1. The second conductive lines CL2 and the second contacts CT2 may be alternately arranged in a third direction D3. The third direction D3 may intersect the first direction D1 and the second direction D2. For example, the third direction D3 may perpendicularly intersect the first direction D1 and the second direction D2. The second contact CT2 may be connected to the second conductive line CL2. The second conductive lines CL2 and the second contacts CT2 may include a conductive material. Although the figures only illustrate second conductive lines CL2 and first pads PA1 in/within the second insulating material 120, example embodiments are not limited thereto, and there may be more layers within the second insulating material 120.

The first pads PA1 may be disposed at a lowermost portion of the second insulating layer 120. Bottom surfaces of the first pads PA1 may be coplanar with a bottom surface of the second insulating layer 120. The first pad PA1 may be connected to the second contact CT2. The first pads PA1 may include a conductive material such as a metal.

A first protective film PL1 covering the bottom surface of the second insulating layer 120 may be provided. The first protective film PL1 may function to protect the second insulating layer 120 and the first pads PA1. The first protective film PL1 may include an insulating material such as at least one of silicon oxide or silicon nitride.

Bumps BP may be provided. The bumps BP may extend through the first protective film PL1. The bump BP may be connected to the first pad PA1 of the conductive structure CS. The bumps BP may include a conductive material such as metal such as a solder metal.

A third insulating layer 130 covering a second surface 102 of the substrate 100 may be provided. The second surface 102 of the substrate 100 may be a surface opposite to the first surface 101 of the substrate 100. When viewed in a viewpoint according to FIG. 1B, the second surface 102 of the substrate 100 may be a top surface of the substrate 100. The third insulating layer 130 may be provided on the substrate 100. The third insulating layer 130 may include an insulating material such as at least one of silicon oxide or silicon nitride, and may be the same, or different, than that of either or both of the first insulating material 110, the second insulating material 120, or the third insulating material 130.

A second protective film PL2 covering a top surface of the third insulating layer 130 may be provided. The second protective film PL2 may function to protect the third insulating layer 130 and the substrate 100. The second protective film PL2 may include an insulating material. In some example embodiments, the second protective film PL2 may be provided on the substrate 100 without provision of the third insulating layer 130 (e.g. directly on the substrate), differently from the shown case.

Second pads PA2 may be provided in the second protective film PL2. The second pad PA2 may be exposed to an outside of the second protective film PL2. A top surface of the second pad PA2 may be coplanar with a top surface of the second protective film PL2. The second pads PA2 may include a conductive material.

Via insulating layers VI extending through the substrate 100 and the insulating structure INS may be provided. The via insulating layer IV may extend in the third direction D3 and, as such, may extend through the substrate 100 and the insulating structure INS. The via insulating layer VI may extend through the first surface 101 of the substrate 100 and the first surface INS_1 of the insulating structure INS. The via insulating layer VI may be provided in/within the via region VIR. The via insulating layer VI may extend along the via region VIR in the second direction D2. The transistor region TSR may be defined among/outside of the via insulating layers VI. The via insulating layer VI may include an insulating material. For example, the via insulating layer VI may include an oxide and/or a nitride.

A first surface VI_1 of the via insulating layer VI may contact the second insulating layer 120. The first surface VI_1 of the via insulating layer VI may contact the second conductive lines CL2 of the conductive structure CS. The first surface VI_1 of the via insulating layer VI may be coplanar with the second surface INS_2 of the insulating structure INS. When viewed in a viewpoint/cross-section according to FIG. 1B, the first surface VI_1 of the via insulating layer VI may be a bottom surface of the via insulating layer VI. A second surface VI_2 of the via insulating layer VI may contact the third insulating layer 130. The second surface VI_2 of the via insulating layer VI may be coplanar with the second surface 102 of the substrate 100. The second surface VI_2 of the via insulating layer VI may be a surface opposite to the first surface VI_1 of the via insulating layer VI. When viewed in a viewpoint/cross-section according to FIG. 1B, the second surface VI_2 of the via insulating layer VI may be a top surface of the via insulating layer VI. The length of the via insulating layer VI in the third direction D3 may be equal to the sum of the lengths of the substrate 100 and the insulating structure INS in the third direction D3. The via insulating layer VI may be spaced apart from any or all of the transistors TR.

Via structures VS may be provided. The via structures VS may extend in the third direction D3 and, as such, may extend through/fully through the via insulating layer VI, the insulating structure INS and the substrate 100. The via structures VS may be disposed in the via region VIR, and no via structures VS may be in the transistor region TSR. A plurality of via structures VS may extend through one via insulating layer IV. A plurality of via structures VS may be surrounded by one via insulating layer VI. One via insulating layer VI may contact outer side walls VS_OS of a plurality of via structures VS.

The second conductive line CL2 of the conductive structure CS may be connected to the via structure VS. A bottom surface VS_B of the via structure VS may contact the second conductive line CL2 of the conductive structure CS. The bottom surface VS_B of the via structure VS may be coplanar with the first surface VI_1 of the via insulating layer VI and the second surface INS_2 of the insulating structure INS. The via structure VS may be connected to the second pad PA2. A top surface VS_T of the via structure VS may contact the second pad PA2. The top surface VS_T of the via structure VS may be coplanar with the top surface of the third insulating layer 130. The length of the via structure VS in the third direction D3 (for example, the vertical length of the via structure VS) may be greater than the length of the via insulating layer VI in the third direction D3. The length of the via structure VS in the third direction D3 may be greater than the sum of the lengths of the substrate 100 and the insulating structure INS in the third direction D3.

The width of the via insulating layer VI in the first direction D1 may be greater than the sum of the widths of a plurality of via structures VS in the first direction D1. For example, the width of the via insulating layer VI in the first direction D1 may be greater than the sum of the widths of two via structures VS in the first direction D1. The width of the via insulating layer VI in the second direction D2 may be greater than the sum of the widths of a plurality of via structures VS in the second direction D2. For example, the width of the via insulating layer IV in the second direction D2 may be greater than the sum of the widths of 10 via structures VS in the second direction D2.

In some example embodiments, the length of the via structure VS in the third direction D3 (e.g. a height of the via structures VS) may be equal to the length of the via insulating layer VI in the third direction D3, differently from the shown case. In this case, the top surface VS_T of the via structure VS, the second surface VI_2 of the via insulating layer VI, and the second surface 102 of the substrate 100 may be coplanar.

Each of, or one or more of, the via structures VS may include a barrier layer BA and a conductive layer CO. Each of the conductive layer CO and the barrier layer BA may extend in the third direction D3 and, as such, may extend through the substrate 100, the insulating structure INS and the via insulating layer VI. The barrier layer BA may surround the conductive layer CO. The barrier layer BA may contact an outer side wall of the conductive layer CO. The conductive layer CO and the barrier layer BA may contact the second conductive line CL2 of the conductive structure CS. The conductive layer CO and the barrier layer BA may contact the second pad PA2. The conductive layer CO and the barrier layer BA may include different conductive materials, respectively. For example, the conductive layer CO may include copper, and the barrier layer BA may include titanium nitride' however, example embodiments are not limited thereto.

The width of the via structure VS may be gradually increased as the via structure VS extends away from the second protective film PL2. The width of the via structure VS may be gradually increased as the via structure VS extends toward the second insulating layer 120, the second contact CT2, the second conductive line CL2, the first pad PA1, the first protective film PL1 and the bump BP. The via structures VS may have a tapered profile.

Referring to FIG. 1C, a distance, such as the minimum distance between adjacent ones of the transistors TR may be defined as a first distance L1.

The minimum distance between each of the via structures VS adjacent to the transistors TR and the transistor TR adjacent thereto may be constant. For example, when the minimum distance between a first via structure VS1 adjacent to the transistors TR and a first transistor TR1 adjacent thereto is defined as a second distance L2, and the minimum distance between a second via structure VS2 adjacent to the transistors TR and a second transistor TR2 adjacent thereto is defined as a third distance L3, the second distance L2 and the third distance L3 may be equal. The second distance L2 and the third distance L3 may be greater than the first distance L1. Although FIG. 1C illustrates that the via structures VS are arranged at corners of a square, example embodiments are not necessarily limited thereto. Although FIG. 1C illustrates that the transistors TR are arranged at corners of a square, example embodiments are not necessarily limited thereto.

The minimum distance between adjacent ones of the via structures VS may be greater than the minimum distance between the via structure VS and the transistor TR adjacent to each other. For example, when the minimum distance between the first and second via structures VS1 and VS2 is defined as a fourth length L4, the fourth distance L4 may be greater than the second distance L2 and the third distance L3.

In some example embodiments, elements other than the transistor TR may be disposed among the via structures VS of the via region VIR. For example, a capacitor and/or a resistor may be disposed among the via structures VS of the via region VIR.

In the semiconductor device according to the example embodiments of the disclosure, via structures VS alone may be disposed in the via region VIR without disposition of any transistor TR. Accordingly, it may be unnecessary or not required/desired to dispose a via structure VS in the transistor region TSR and, as such, transistors TR may be relatively densely disposed in the transistor region TSR. Thus, the size of the semiconductor device may be reduced. As a size of a semiconductor device decreases, yield and/or manufacturing costs may be improved.

FIGS. 2A, 2B, 2C, 2D, 2E, 2F, 2G, 2H, and 2I are cross-sectional views explaining a method for manufacturing/fabricating the semiconductor device according to FIGS. 1A, 1B and 1C.

Referring to FIG. 2A, an element isolation film IS may be formed in a substrate 100, and a transistor TR, first contacts CT1, first conductive lines CL1, and an insulating structure INS including a first insulating layer 110 and a mask layer MA may be formed on the substrate 100. The transistor TR may be formed in a transistor region TSR, and may not be formed in a via region VIR. The transistor TR may be formed on a first surface 101 of the substrate 100.

A trench TC extending through the insulating structure INS and a portion of the substrate 100 may be formed. The trench TC may be formed in the via region VIR. Formation of the trench TC may include forming a first photoresist pattern PP1, and etching (e.g. wet and/or dry etching) the insulating structure INS and the substrate 100 using the first photoresist pattern PP1 as an etch mask. The trench TR may be defined by surfaces of the insulating structure INS and surfaces of the substrate 100. The trench TC may extend in a second direction D2. After formation of the trench TC, the remaining photoresist pattern PP1 may be removed.

Figure 2B:
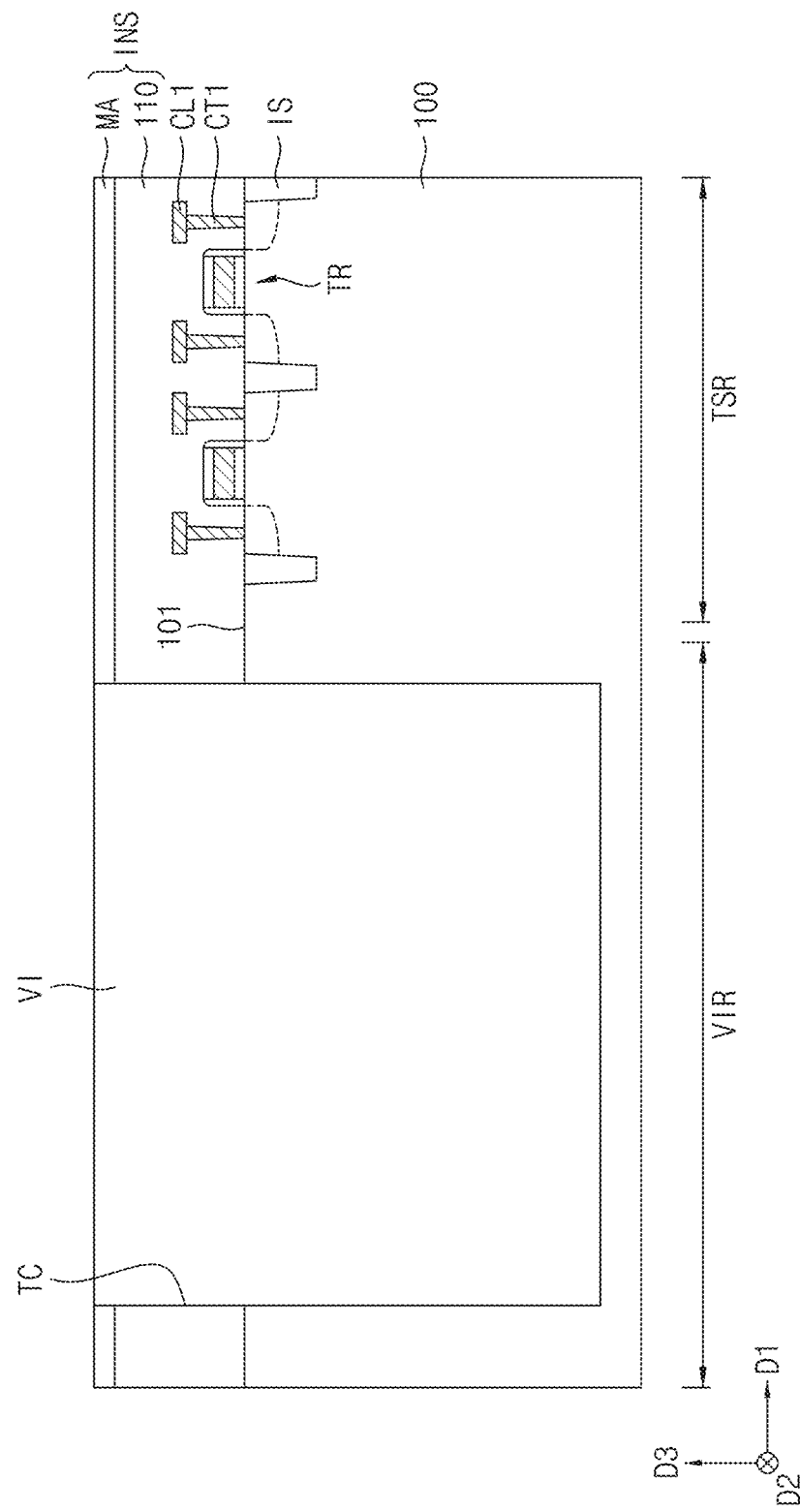

Referring to FIG. 2B, a via insulating layer VI may be formed in the trench TC. Formation of the via insulating layer VI may include depositing an insulating material on the surfaces of the insulating structure INS and the substrate 100, and performing a planarizing process. The insulating material may be deposited with a chemical vapor deposition (CVD) process and/or an atomic layer deposition (ALD) process; however, example embodiments are not limited thereto. The planarizing process may be or may include a chemical mechanical planarization (CMP) process and/or an etch-back process; however, example embodiments are not limited thereto.

Figure 2C:
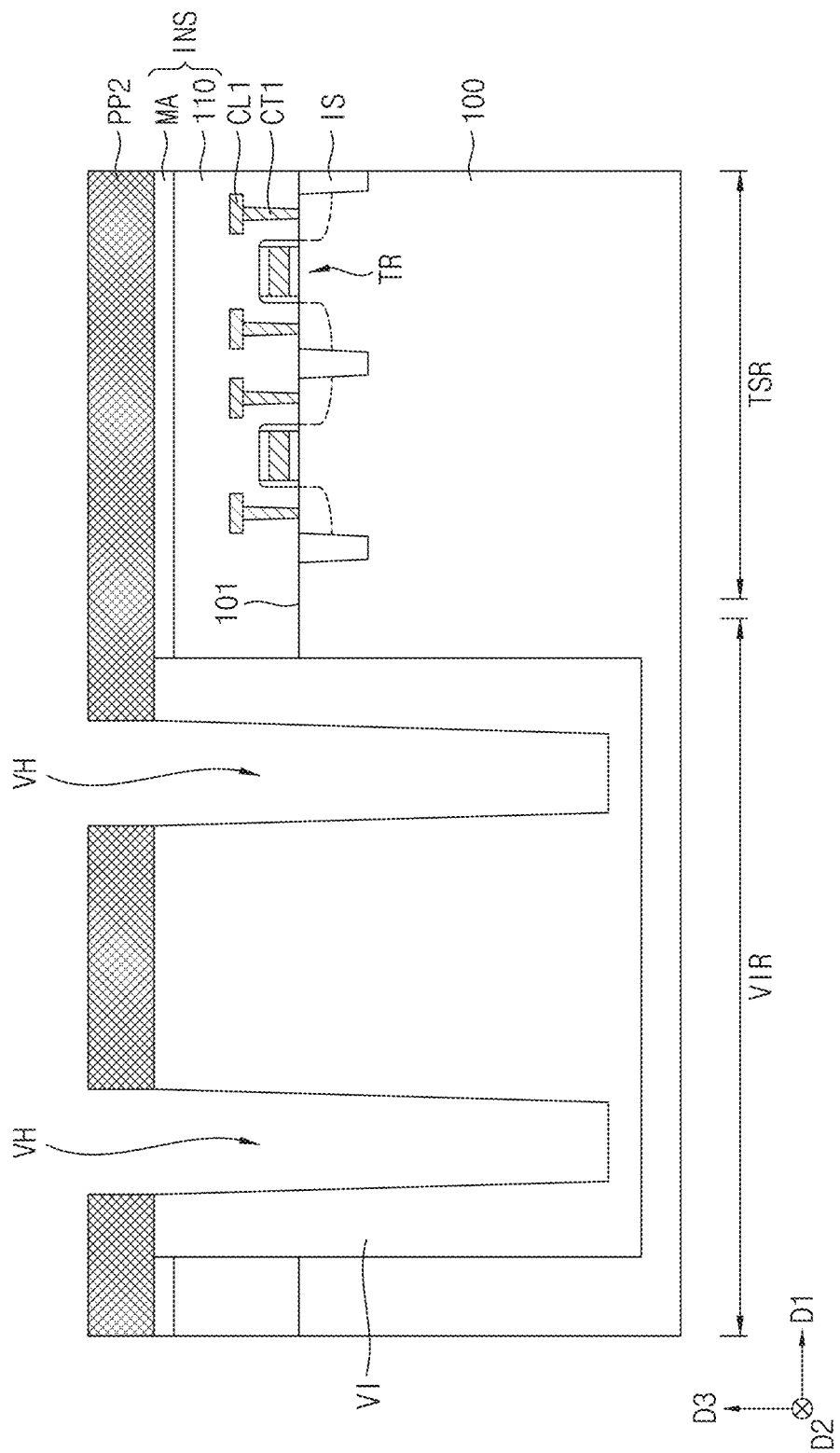

Referring to FIG. 2C, via holes VH may be formed in the via insulating layer VI. Formation of the via holes VH may include forming a second photoresist pattern PP2 on the insulating structure INS and the via insulating layer VI, and etching the via insulating layer IV using the second photoresist pattern PP2 as an etch mask. A plurality of via holes VH may be formed at one or within one via insulating layer VI. The via hole VH may be defined by a surface of the via insulating layer VI. After formation of the via holes VH, the remaining second photoresist pattern PP2 may be removed.

Figure 2D:
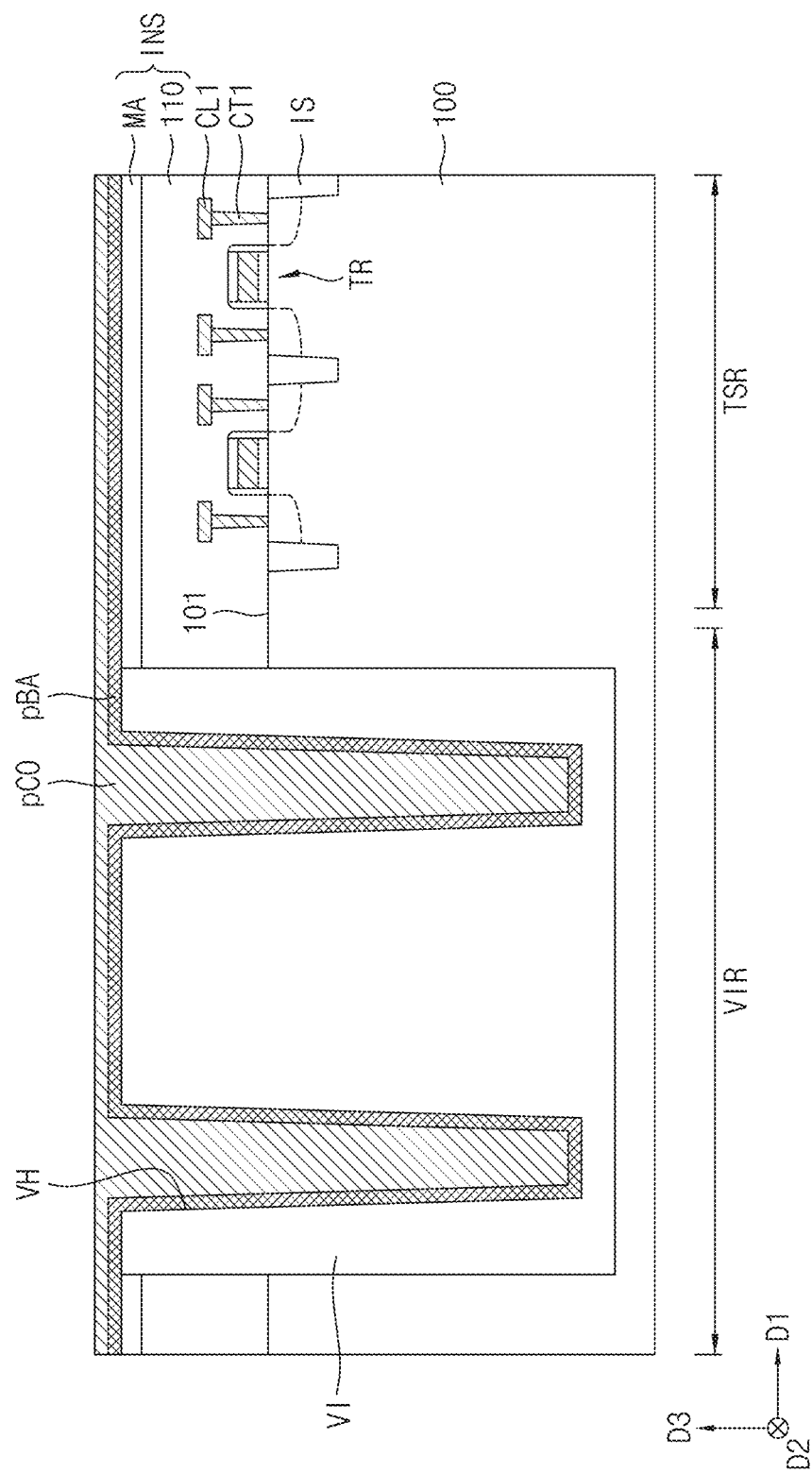

Referring to FIG. 2D, a preliminary barrier layer pBA and a preliminary conductive layer pCO may be formed. The preliminary barrier layer pBA may be formed on surfaces of the insulating structure INS and the via insulating layer VI, and the preliminary conductive layer pCO may be formed on the preliminary barrier layer pBA. The preliminary barrier layer pBA and the preliminary conductive layer pCO may fill the via holes VH. The preliminary barrier layer pBA and the preliminary conductive layer pCO may include the same and/or different conductive materials, respectively.

Figure 2E:
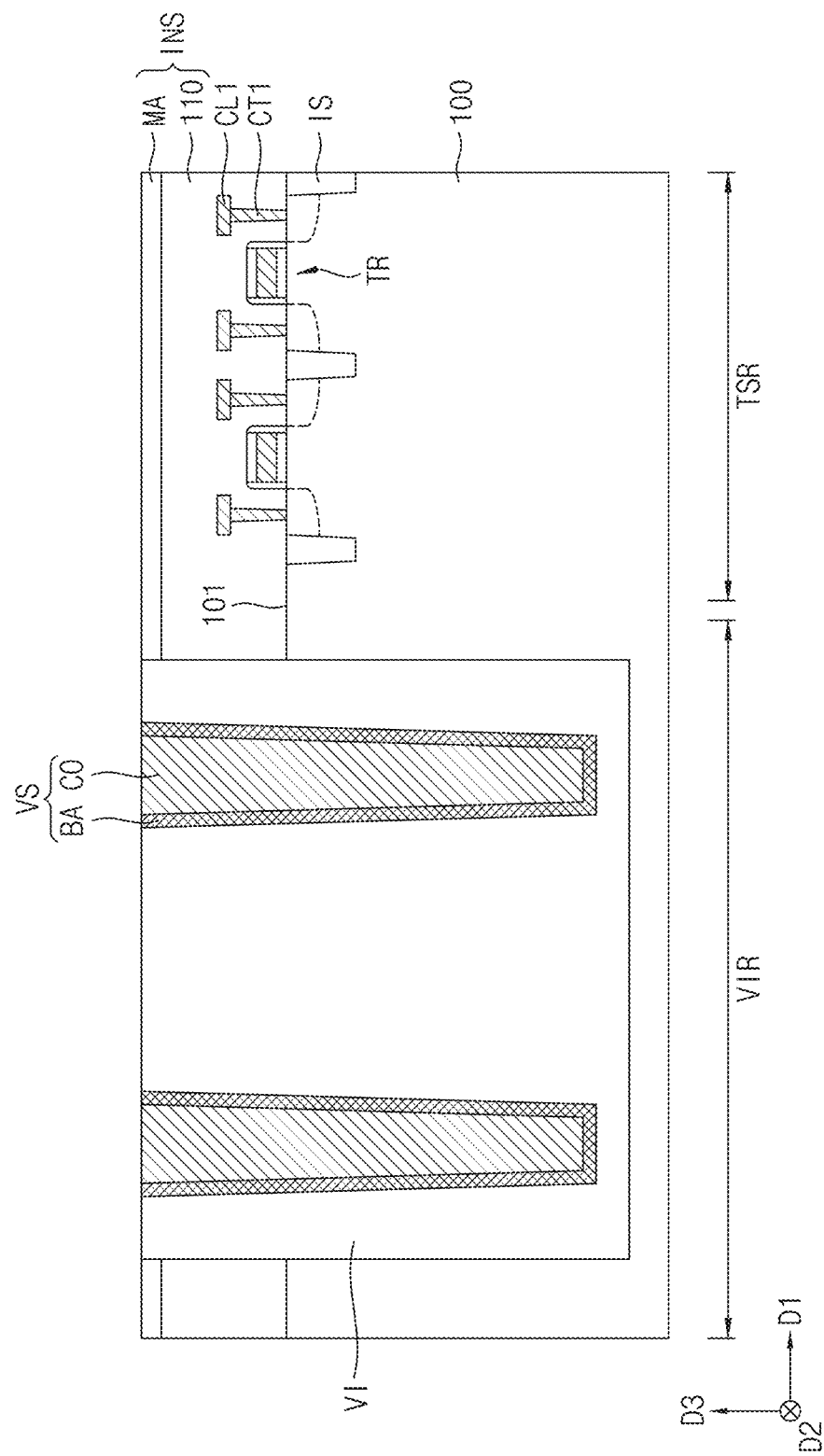

Referring to FIG. 2E, a via structure VS may be formed. In some example embodiments, an upper portion of the preliminary barrier layer pBA and an upper portion of the preliminary conductive layer pCO may be removed through execution of a polishing process. The preliminary barrier layer pBA, the upper portion of which has been removed, may be defined as a barrier layer BA. The preliminary conductive layer pCO, the upper portion of which has been removed, may be defined as a conductive layer CO.

Figure 2F:
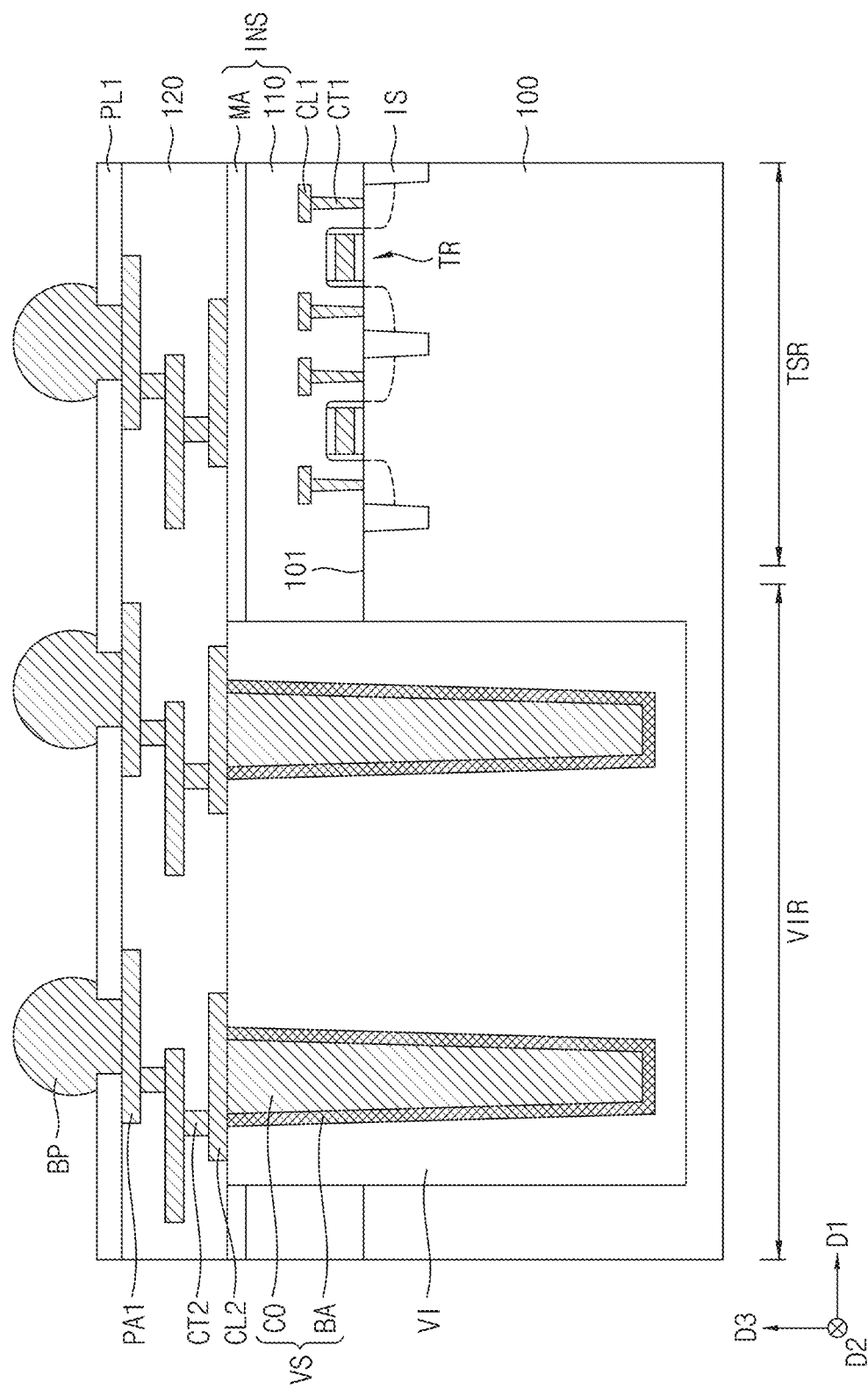

Referring to FIG. 2F, a second insulating layer 120, second conductive lines CL2, second contacts CT2, first pads PA1, a first protective film PL1, and bumps BP may be formed on the insulating structure INS, the via insulating layer VI and the via structure VS.

Figure 2G:
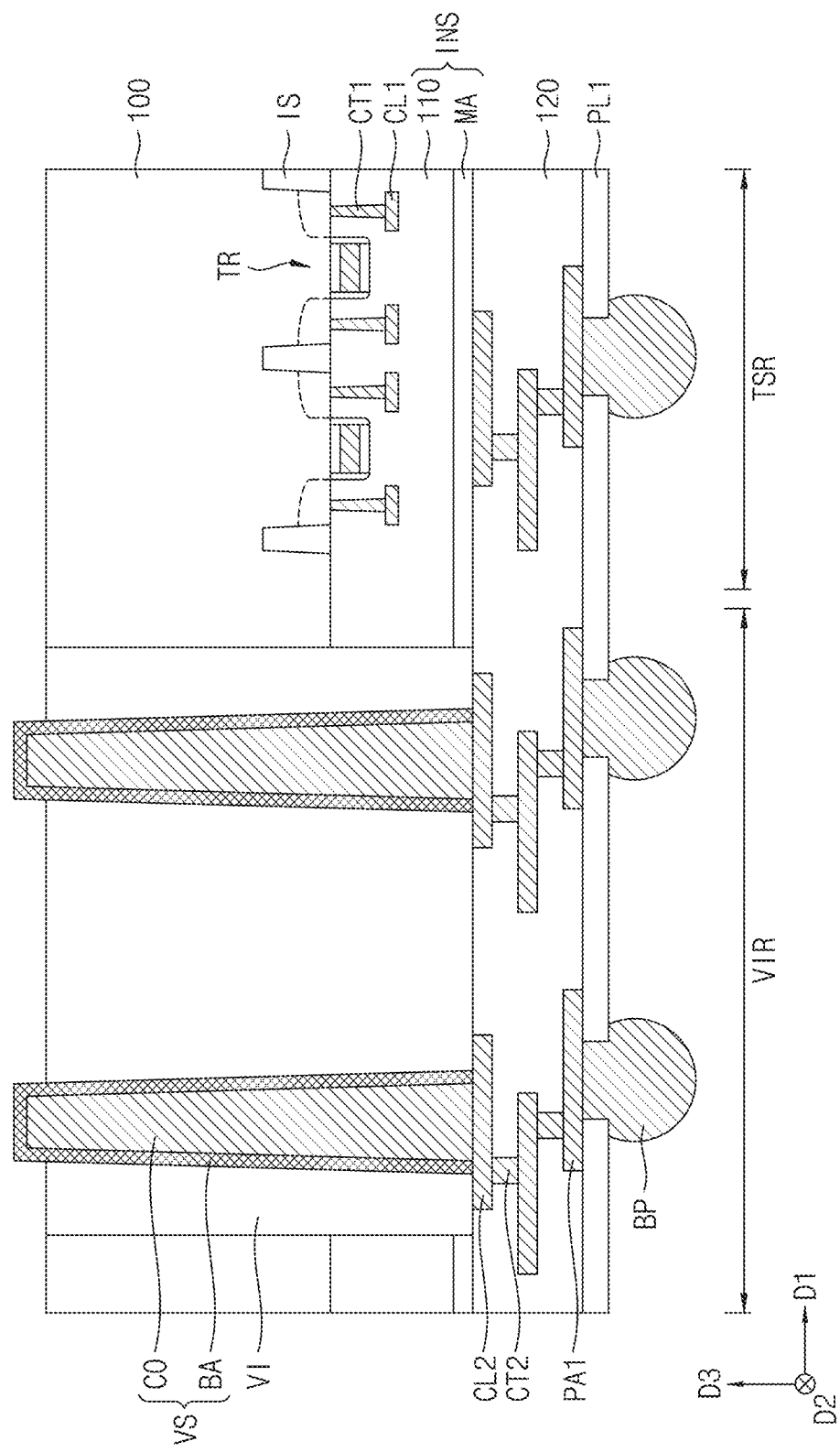

Referring to FIG. 2G, the substrate 100 may be inverted (e.g. flipped). Subsequently, a portion of the substrate 100 and a portion of the via insulating layer VI may be removed with a process such as a CMP process and/or an etching process, such that the via structures VS are exposed. As the portion of the substrate 100 and the portion of the via insulating layer VI are removed, the barrier layer BA of the via structure VS may be exposed.

Figure 2H:
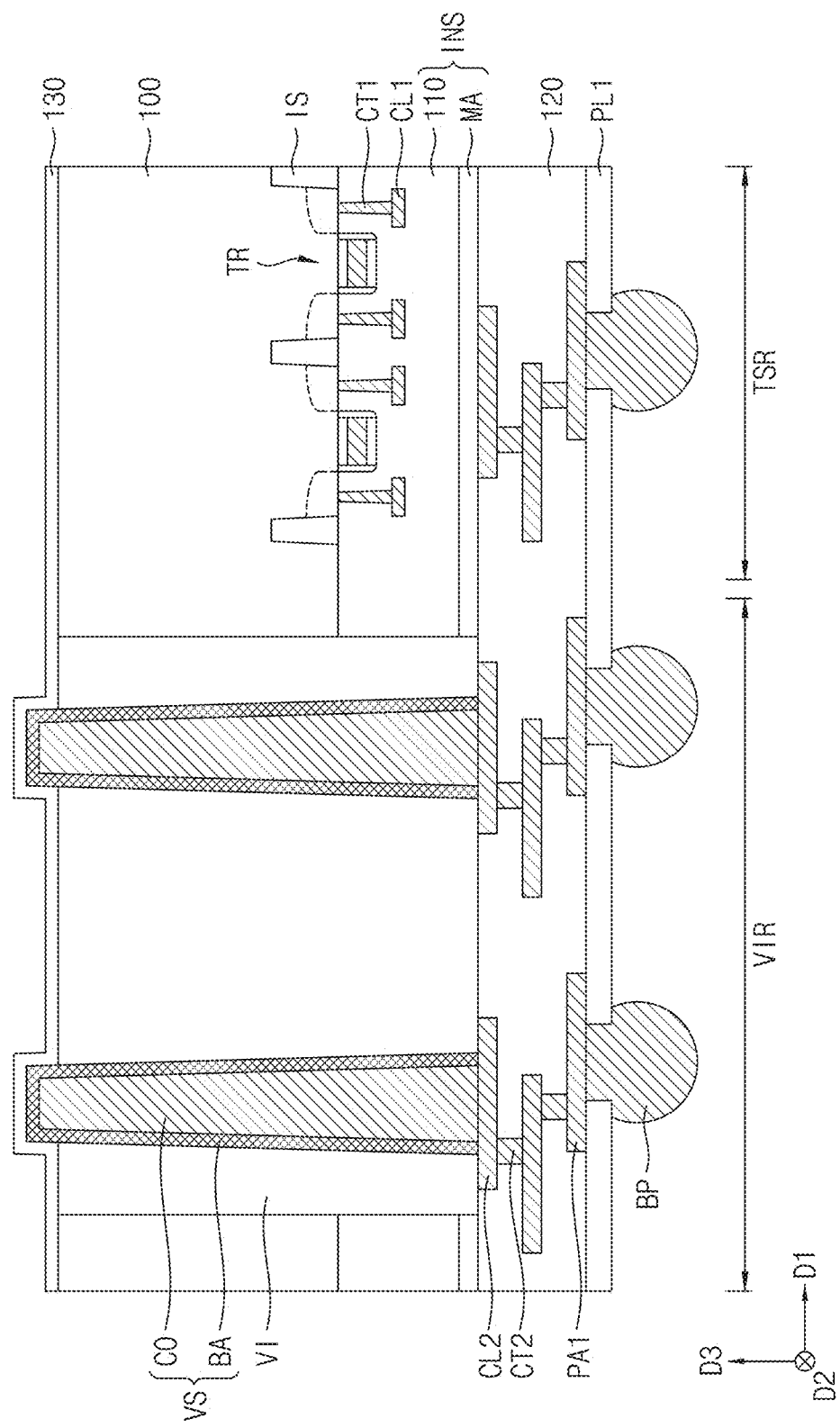
Figure 21:
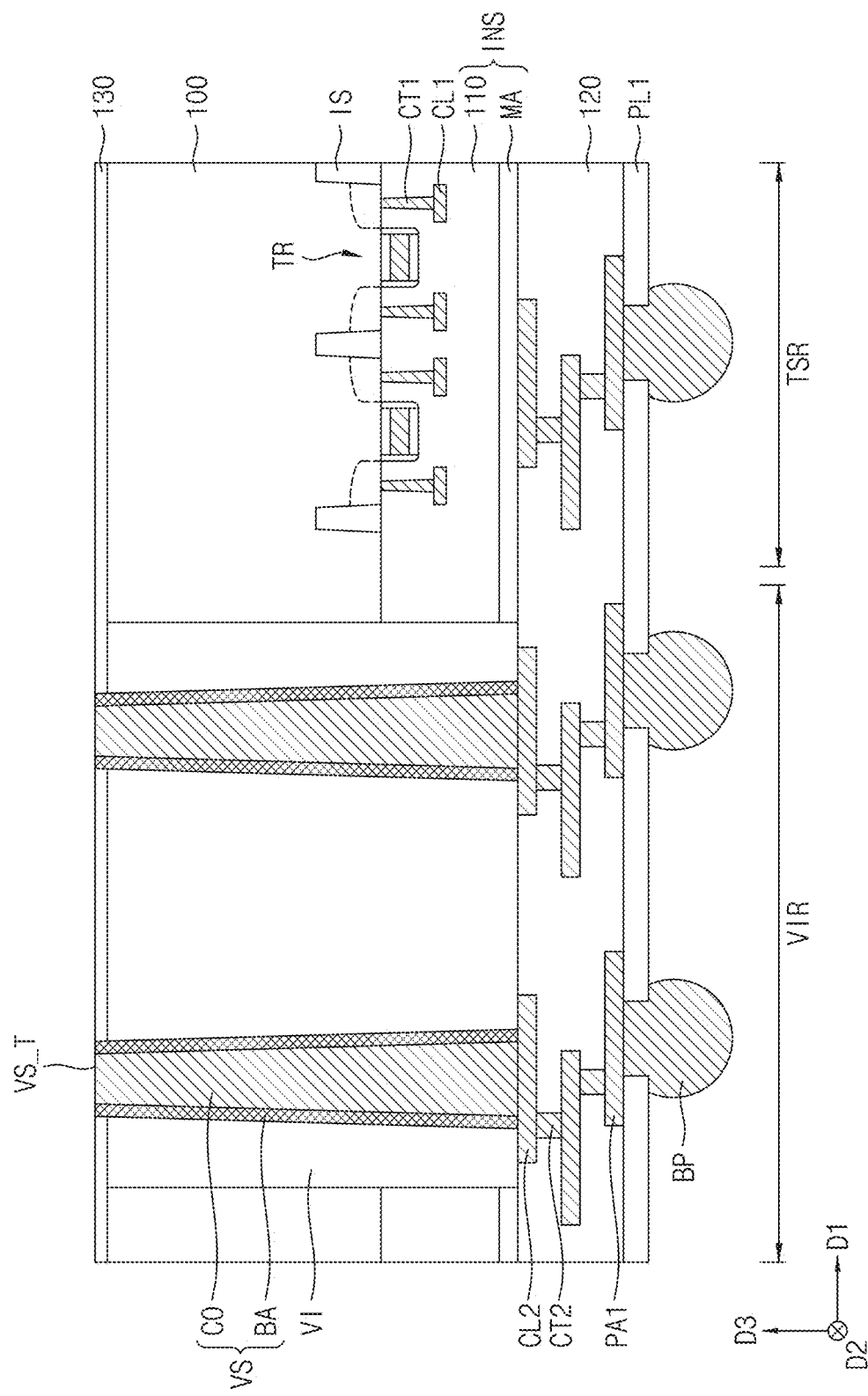

Referring to FIG. 2H, a third insulating layer 130 covering the substrate 100, the via insulating layer VI and the via structures VS may be formed. For example, the third insulating layer 130 may be conformally deposited on the substrate 100, the via insulating layer VI, and the via structures VS.

Referring to FIG. 2I, a portion of the third insulating layer 130 and a portion of the via structure VS may be removed. In some example embodiments, the portion of the third insulating layer 130 and the portion of the via structure VS may be removed by a polishing process; however, example embodiments are not limited thereto.

A top surface VS_T of the via structure VS may be exposed. A top surface of the third insulating layer 130 and the top surface VS_T of the via structure VS may become coplanar.

In some example embodiments, a polishing process for removing an upper portion of the substrate 100, an upper portion of the via insulating layer VI and upper portions of the via structures VS may be performed after formation of the bumps BP and subsequent inversion of the substrate 100. For example, the portion of the via structure VS may be removed in the process of removing the portion of the substrate 100 and the portion of the via insulating layer VI, as described with reference to FIG. 2G, together with these portions. In this case, a top surface of the substrate 100, top surfaces of the via structures VS, and a top surface of the via insulating layer VI may become coplanar.

Referring back to FIG. 1B, a second protective film PL2 covering the third insulating layer 130 may be formed, and second pads PA2 may be formed in the second protective film PL2.

Figure 3:
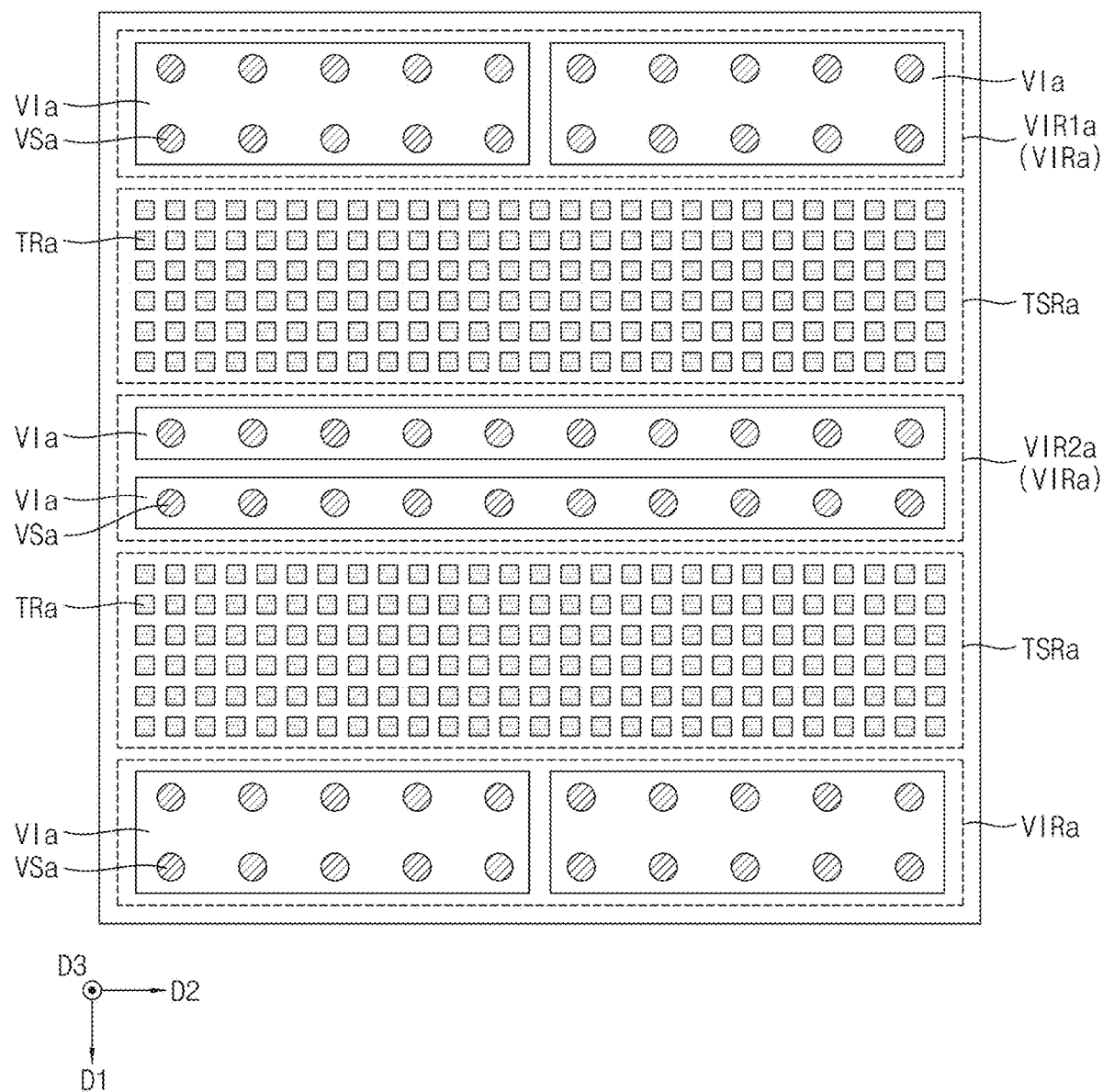
FIG. 3 is a plan view of a semiconductor device according to some example embodiments of the disclosure.

FIG. 3 is a plan view of a semiconductor device according to some example embodiments of the disclosure.

Referring to FIG. 3, the semiconductor device may include transistor regions TSRa where transistors TRa are disposed, and via regions VIRa where via structures VSa are disposed. There may be no transistors TRa in any via regions VIRa on the semiconductor device, and there may be no via structures VSa in any of the transistor regions TSRa of the semiconductor device.

A plurality of via insulating layers VIa may be disposed in each of the via regions VIRa. Via insulating layers VIa disposed in a first via region VIR1a may be arranged in a second direction D2. The via insulating layers VIa disposed in the first via region VIR1a may be spaced apart from each other in the second direction D2.

Via insulating layers VIa disposed in a second via region VIR2a may be arranged in a first direction D1. The via insulating layers VIa disposed in the second via region VIR2a may be spaced apart from each other in the first direction D2.

Figure 4A:
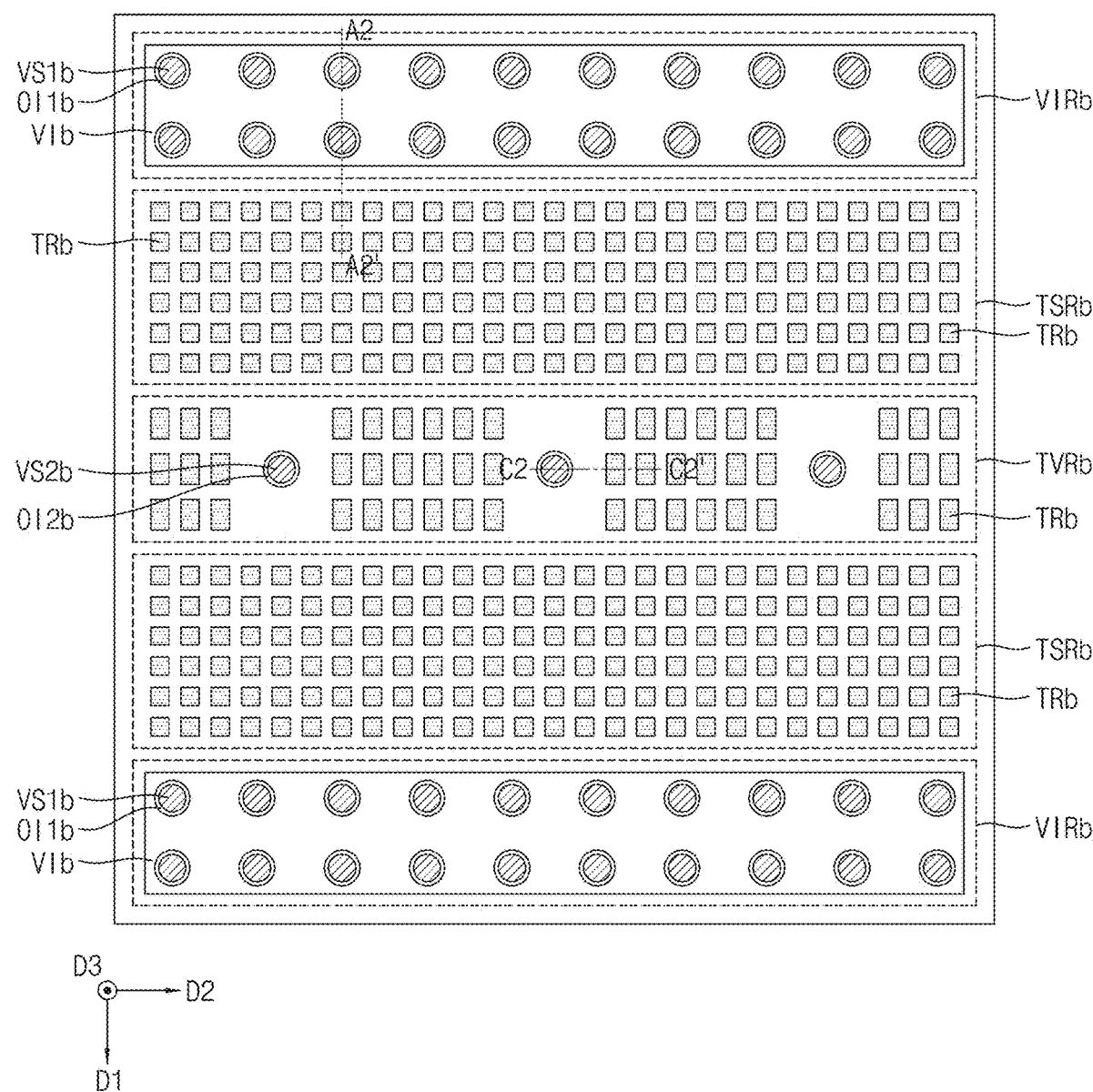
FIG. 4A is a plan view of a semiconductor device according to some example embodiments of the disclosure.
Figure 4B:
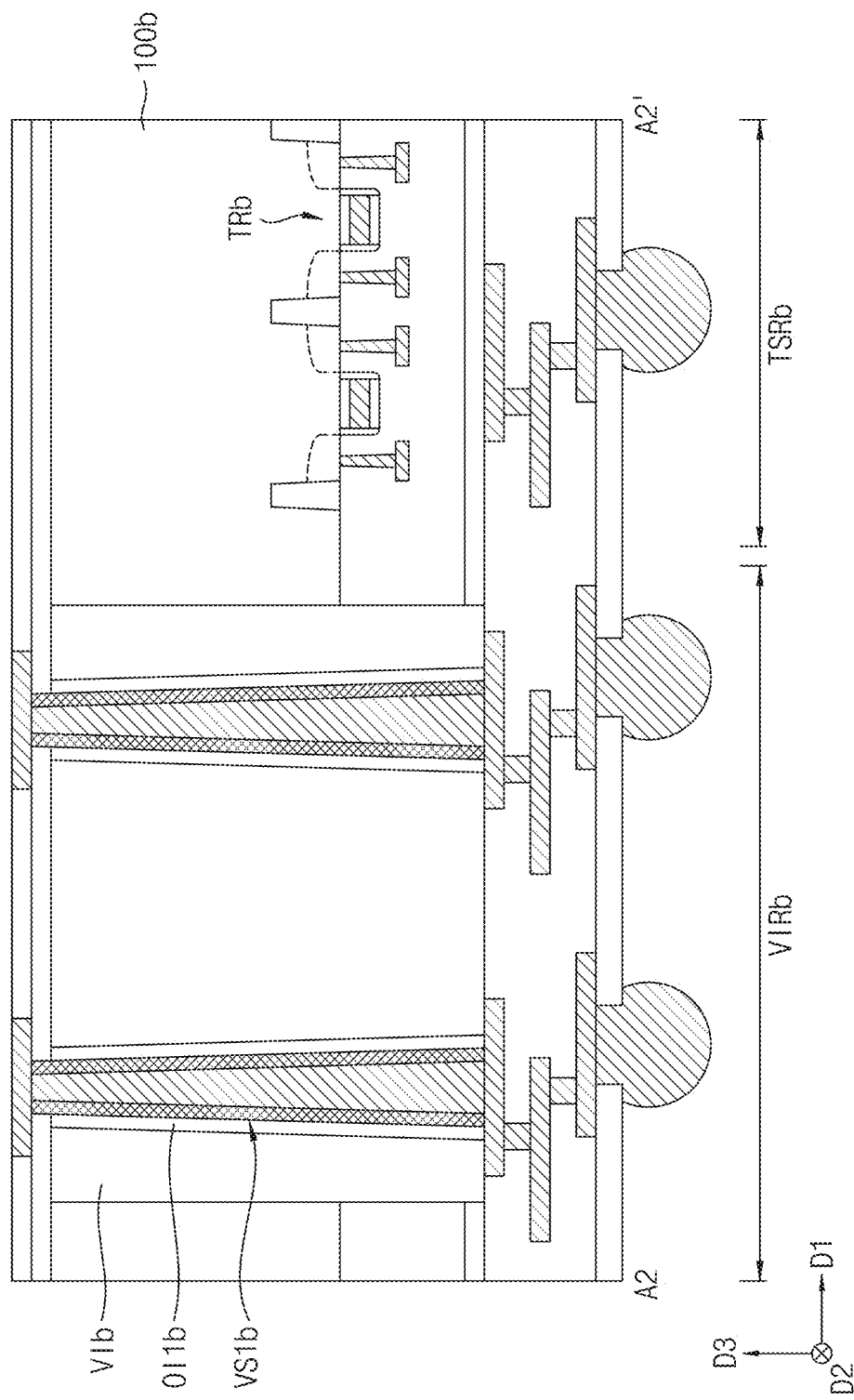
FIG. 4B is a cross-sectional view taken along line A2-A2' in FIG. 4A.
Figure 4C:
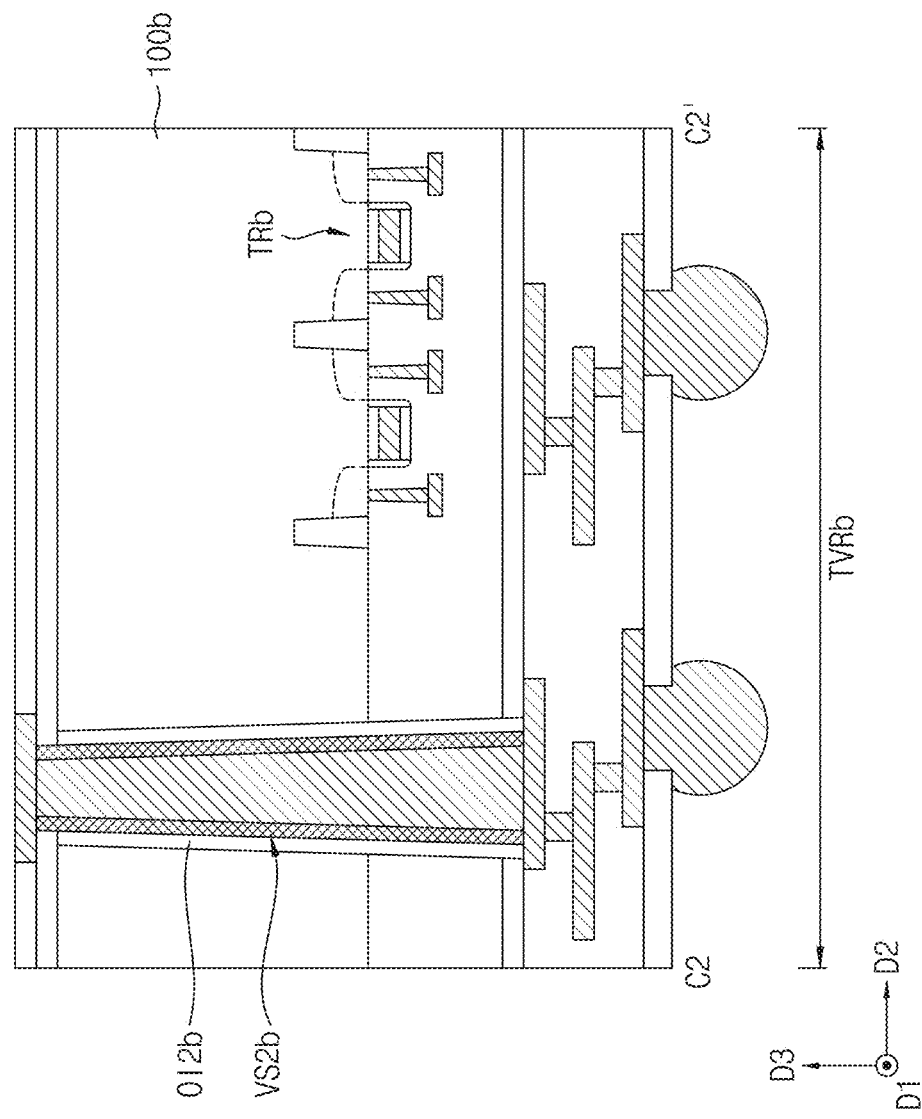
FIG. 4C is a cross-sectional view taken along line C2-C2' in FIG. 4A.

FIG. 4A is a plan view of a semiconductor device according to some example embodiments of the disclosure. FIG. 4B is a cross-sectional view taken along line A2-A2' in FIG. 4A. FIG. 4C is a cross-sectional view taken along line C2-C2' in FIG. 4A.

Referring to FIGS. 4A, 4B, and 4C, the semiconductor device may include transistor regions TSRb where transistors TRb are disposed, via regions VIRb where first via structures VS1b are disposed, and a transistor via region TVRb where transistors TRb and second via structures VS2b are disposed. The transistor regions TSRb may be disposed between the via regions VIRb, and the transistor via region TVRb may be disposed between the transistor regions TSRb. No transistors in any via region, and there may be no via structures in any transistor region.

First outer insulating layers OI1b may be provided. The first outer insulating layers OI1b may be provided in the via region VIRb. The first outer insulating layer OI1b may surround the first via structure VS1b. The first outer insulating layer OI1b may contact an outer side wall of the first via structure VS1b. A plurality of first outer insulating layers OI1b may be surrounded by one via insulating layer VIb. Outer side walls of a plurality of first outer insulating layers OI1b may contact one via insulating layer VIb. A plurality of first outer insulating layers OI1b may extend through one via insulating layer VIb. The first outer insulating layers OI1b may include an insulating material. For example, the first outer insulating layers OI1b may include an oxide.

Second outer insulating layers OI2b may be provided. The second outer insulating layers OI2b may be provided in the transistor via region TVRb. The second outer insulating layer OI2b may surround the second via structure VS2b. The second outer insulating layer OI2b may contact an outer side wall of the second via structure VS2b. A plurality of second outer insulating layers OI2b may be surrounded by a substrate 100b. Outer side walls of a plurality of second outer insulating layers OI2b may contact the substrate 100b. The second outer insulating layers OI2b may include an insulating material. For example, the second outer insulating layers OI2b may include an oxide and/or a nitride.

A distance, such as the minimum distance between the first via structure VS1b adjacent to the transistor region TSRb and the transistor TRb adjacent thereto, the minimum distance between the second via structure VS2b and the transistor TRb in the transistor region TSRb adjacent thereto, and between the second via structure VS2b and the transistor TRb in the transistor via region TVRb adjacent thereto may be constant.

FIGS. 5A, 5B, 5C, 5D, 5E, and 5F are cross-sectional views explaining a method for manufacturing the semiconductor device according to FIGS. 4A, 4B, and 4C.

Figure 5A:
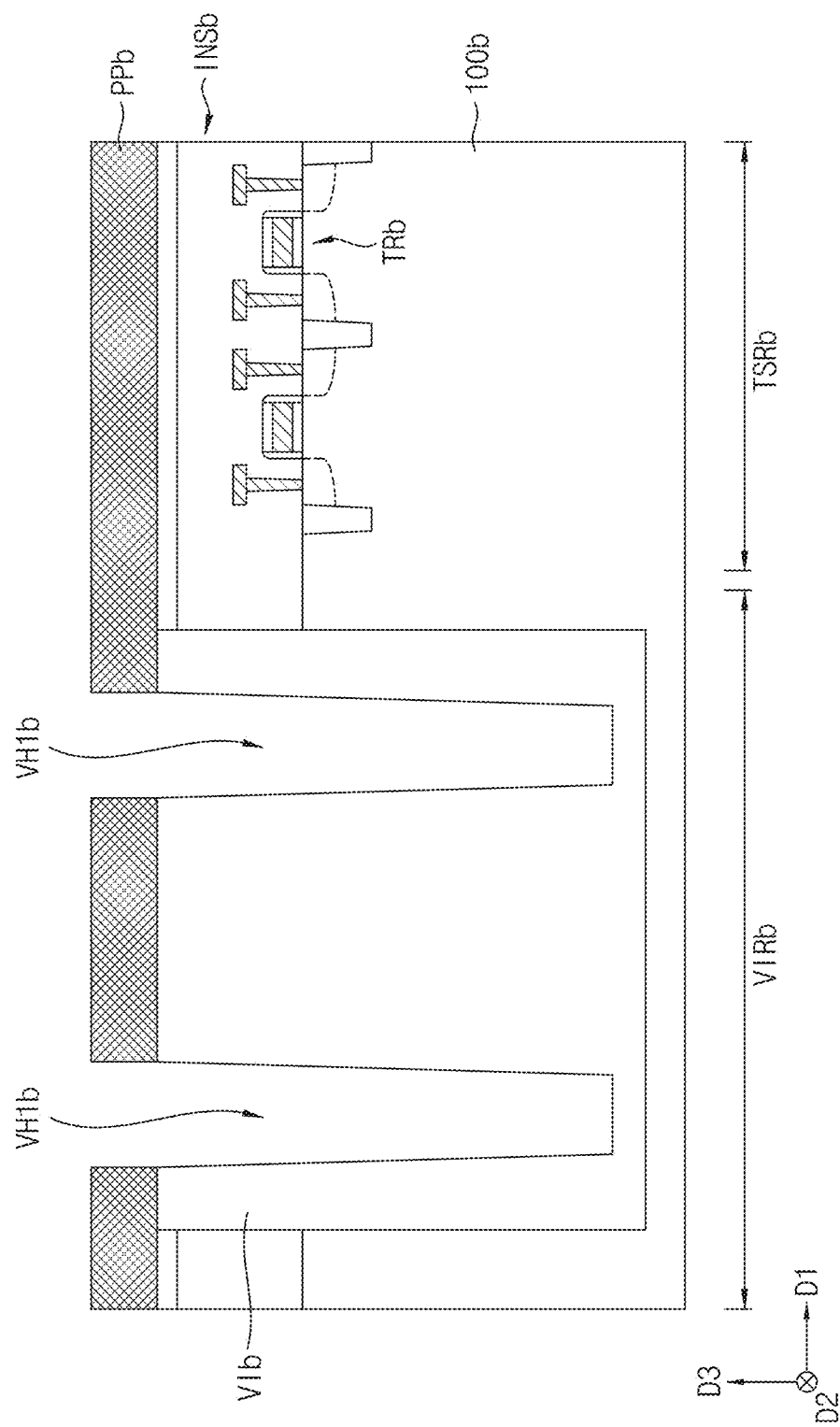
Figure 5B:
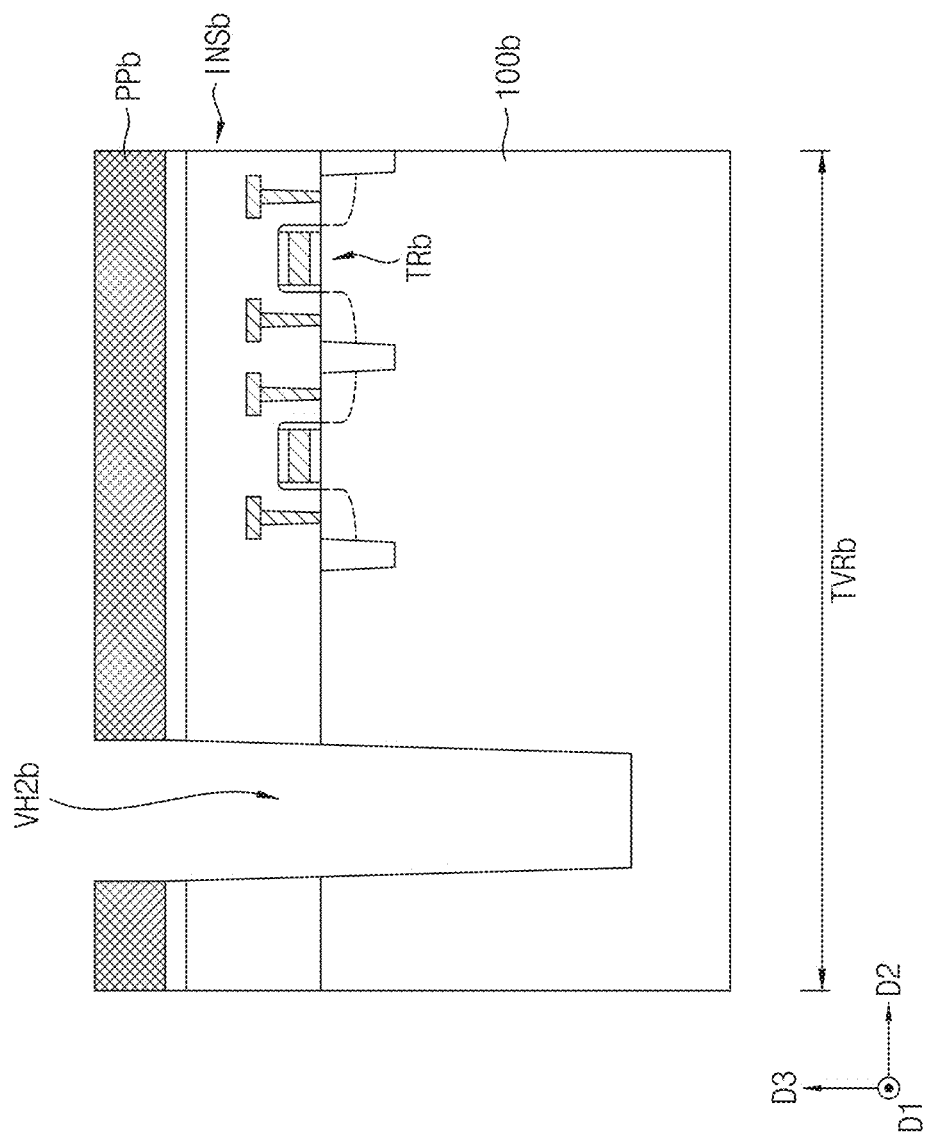

Referring to FIGS. 5A and 5B, a substrate 100b and an insulating structure INSb may be formed, and transistors TRb may be formed between the substrate 100b and the insulating structure INSb. Subsequently, a via insulating layer VIb may be formed in a via region VIRb.

A photoresist pattern PPb may be formed on the insulating structure INSb and the via insulating layer VIb. The via insulating layer VIb, the insulating structure INSb, and the substrate 100b may be etched using the photoresist pattern PPb as an etch mask, thereby forming first and second via holes VH1b and VH2b. The first via hole VI1b may be formed in the via region VIRb. The second via hole VH2b may be formed in a transistor via region TVRb. After formation of the first and second via holes VH1b and VH2b, the remaining photoresist pattern PPb may be removed.

Figure 5C:
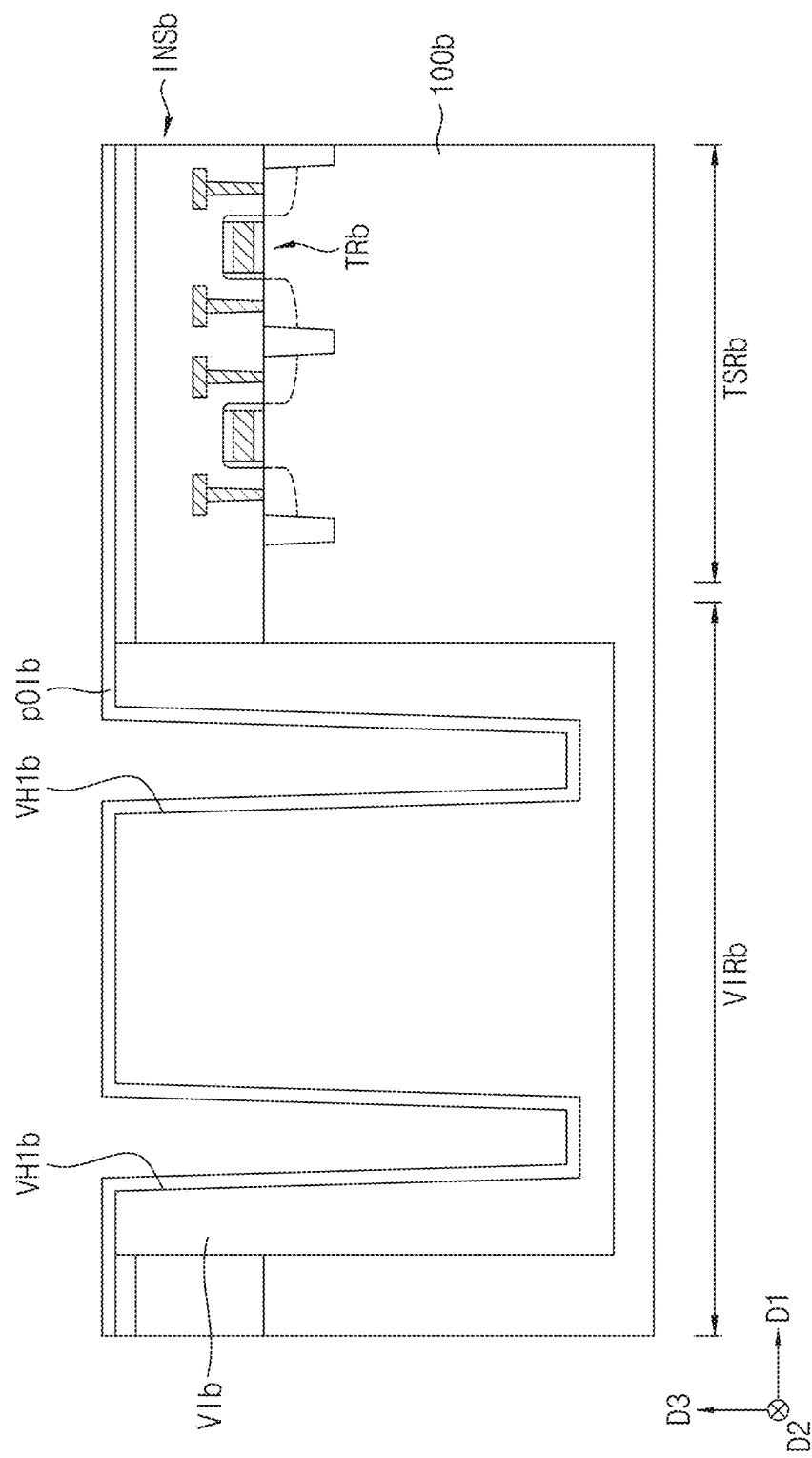
Figure 5D:
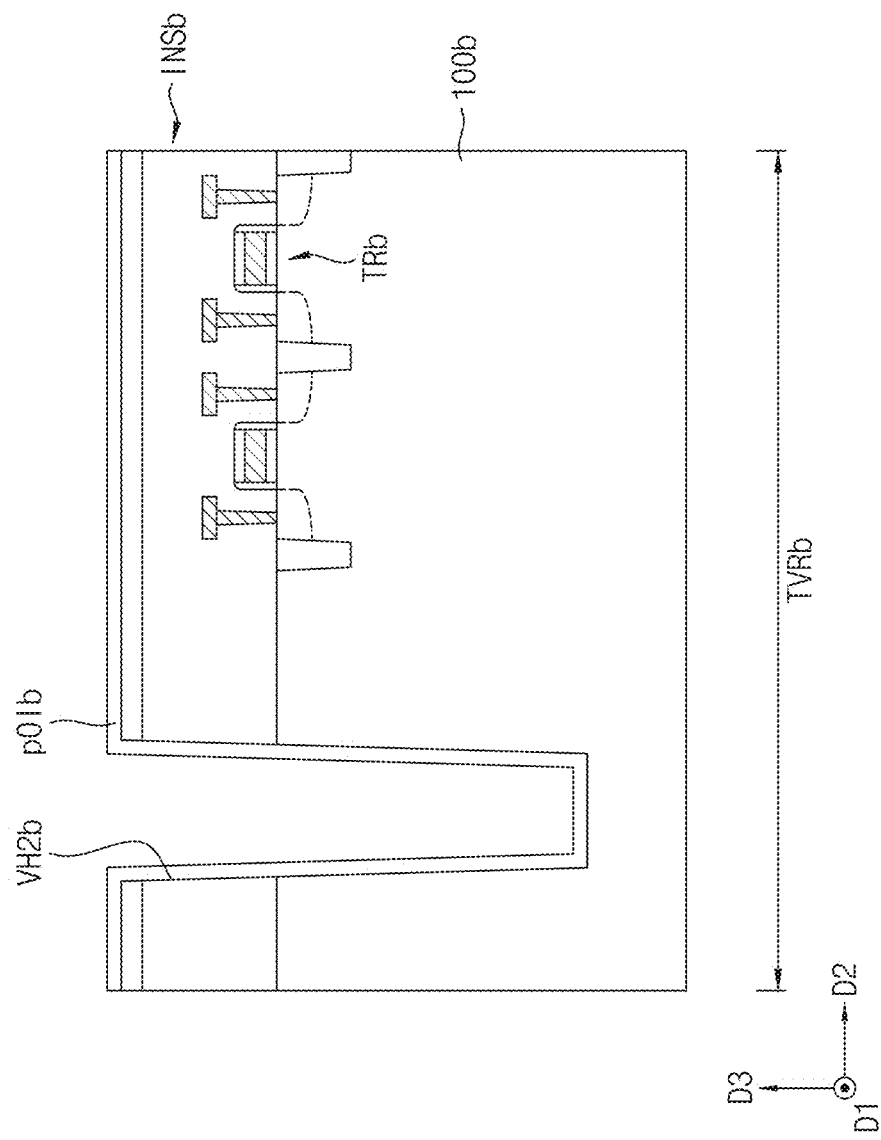

Referring to FIGS. 5C and 5D, a preliminary outer insulating layer pOIb may be formed. The preliminary outer insulating layer pOIb may conformally cover the via region VIRb, a transistor region TSRb, and the transistor via region TVRb. The preliminary outer insulating layer pOIb may conformally cover surfaces of the via insulating layer VIb, the insulating structure INSb and the substrate 100b. Some portions of the preliminary outer insulating layer pOIb may be formed in the first and second via holes VH1b and VH2b.

Figure 5F:
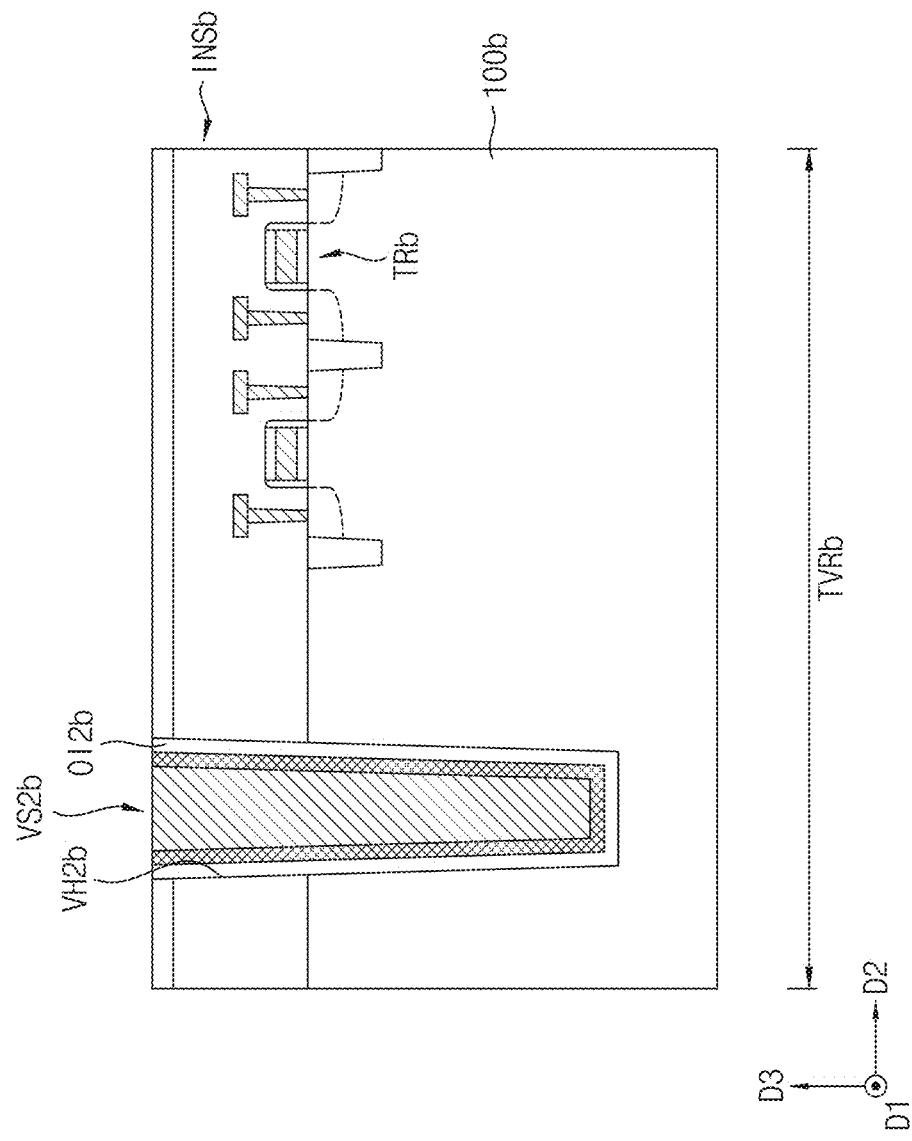

Referring to FIGS. 5E and 5F, first and second via structures VS1b and VS2b may be formed. Formation of the first and second via structures VS1b and VS2b may include depositing a preliminary barrier layer and a preliminary conductive layer, and performing a polishing process of removing upper portions of the preliminary barrier layer and the preliminary conductive layer.

In accordance with the polishing process of removing the upper portions of the preliminary barrier layer and the preliminary conductive layer, an upper portion of the preliminary outer insulating layer pOIb may be removed. As the upper portion of the preliminary outer insulating layer pOIb is removed, the preliminary outer insulating layer pOIb may be separated into first and second outer insulating layers OI1b and OI2b.

Referring to FIGS. 4A, 4B, and 4C, the remaining constituent elements of the semiconductor device may be formed through processes similar to the processes described above.

Figure 6:
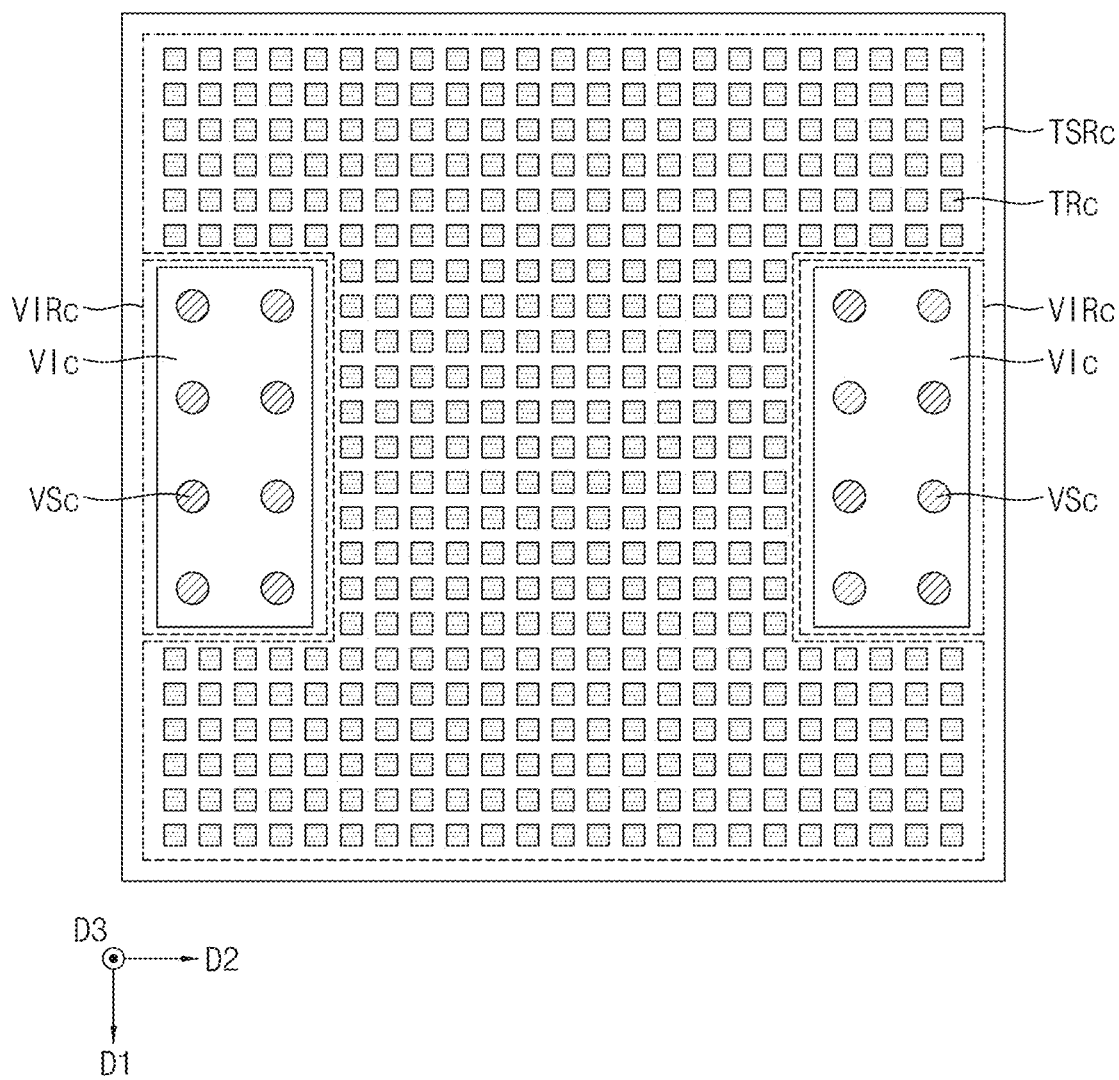
FIG. 6 is a plan view of a semiconductor device according to some example embodiments of the disclosure.

FIG. 6 is a plan view of a semiconductor device according to some example embodiments of the disclosure.

Referring to FIG. 6, the semiconductor device may include via regions VIRc where via structures VSc and a via insulating layer VIc are disposed, and a transistor region TSRc where transistors TRc are disposed.

A portion of the transistor region TSRc may be disposed between the via regions VIRc. Three sides from among four sides of the via region VIRc may face the transistor region TSRc.

Figure 7:
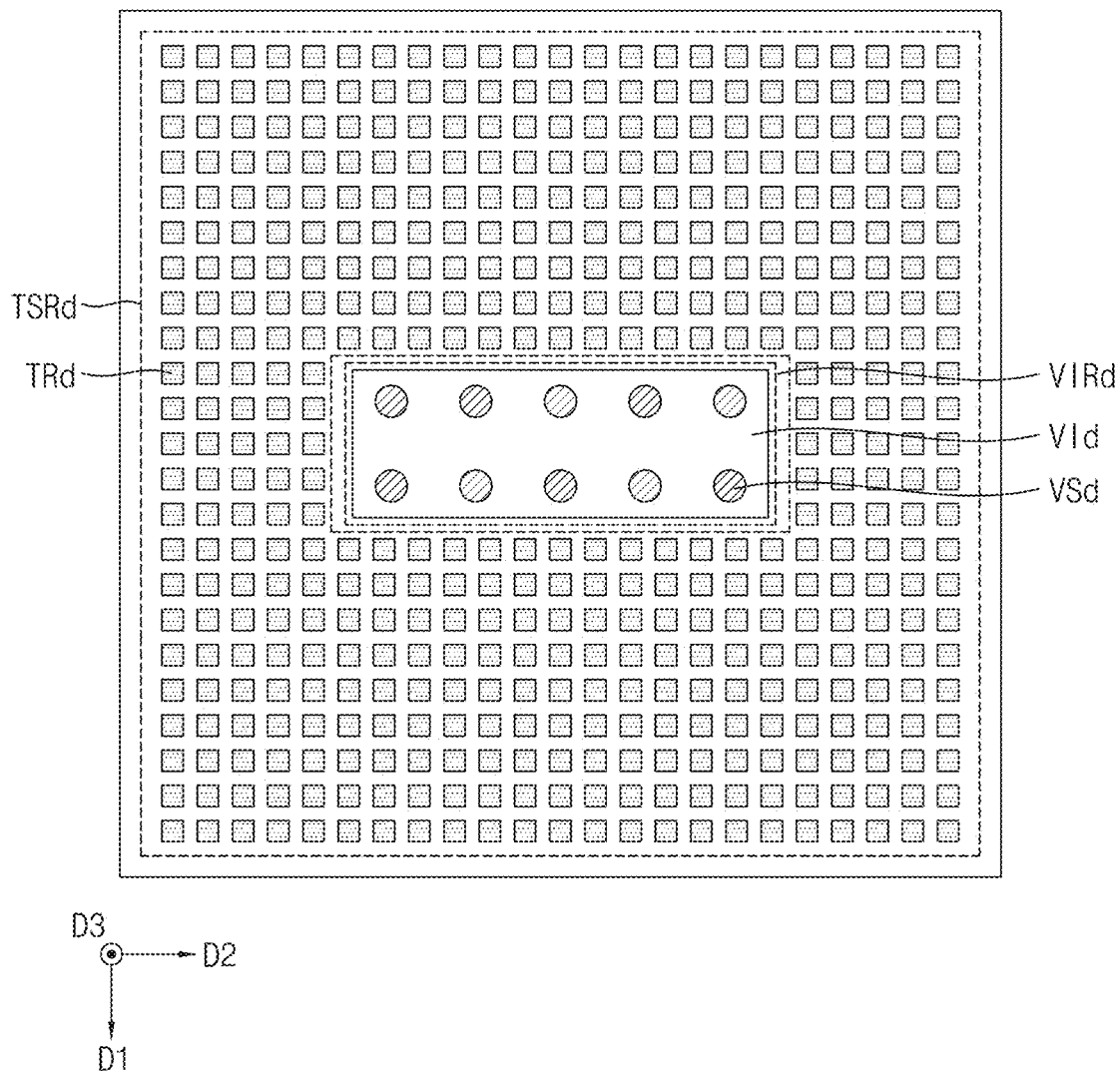
FIG. 7 is a plan view of a semiconductor device according to some example embodiments of the disclosure.

FIG. 7 is a plan view of a semiconductor device according to some example embodiments of the disclosure.

Referring to FIG. 7, the semiconductor device may include a via region VIRd where via structures VSd and a via insulating layer VId are disposed, and a transistor region TSRd where transistors TRd are disposed. The transistor region TSRd may surround the via region VIRd.

Figure 8:
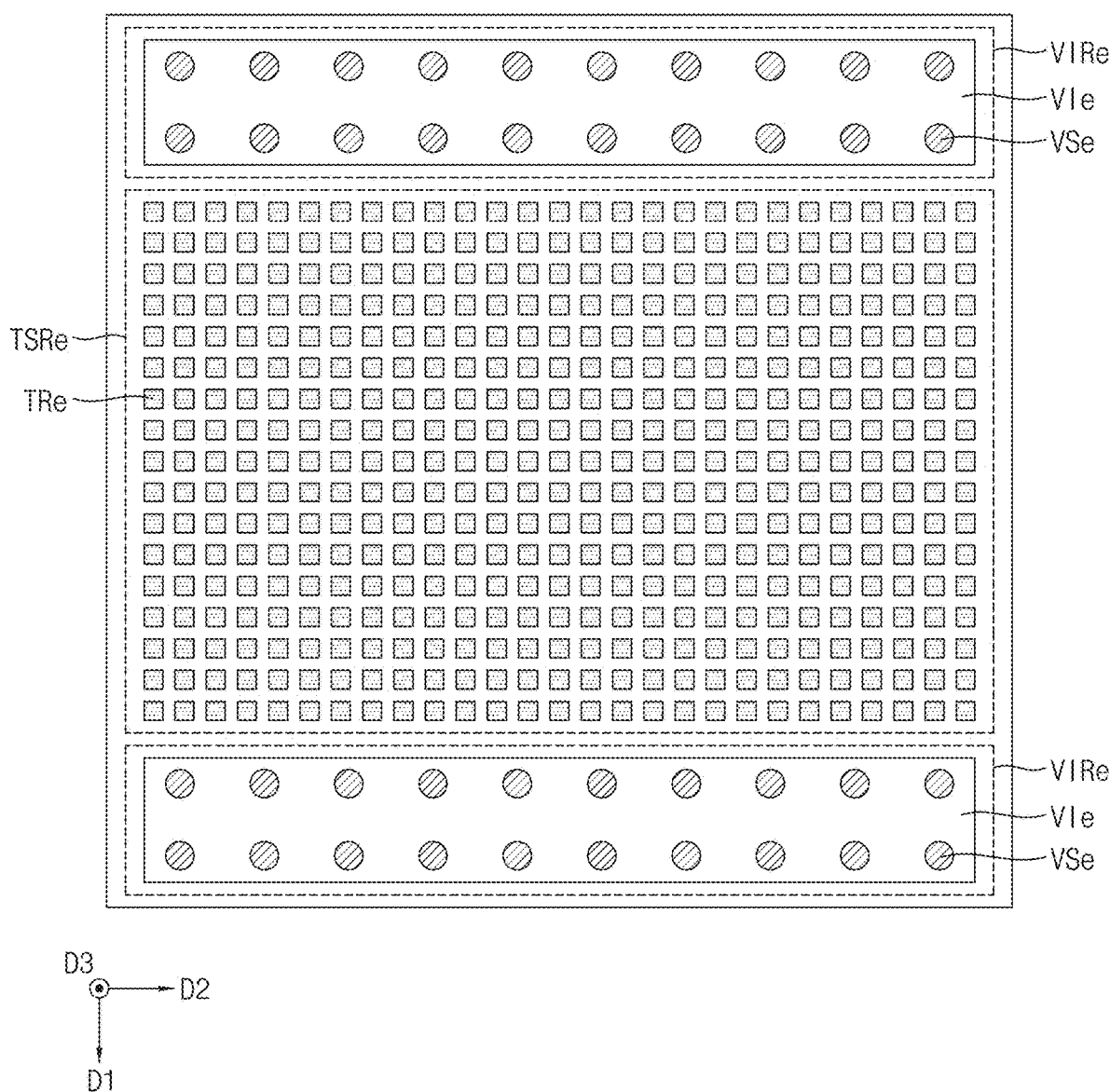
FIG. 8 is a plan view of a semiconductor device according to some example embodiments of the disclosure.

FIG. 8 is a plan view of a semiconductor device according to some example embodiments of the disclosure.

Referring to FIG. 8, the semiconductor device may include a via region VIRe where via structures VSe and a via insulating layer VIe are disposed, and a transistor region TSRe where transistors TRe are disposed. The via regions VIRe may be disposed opposite side ends of the semiconductor device, respectively. The transistor region TSRe may be disposed between the via regions VIRe. The transistor region TSRe may be disposed at a central portion of the semiconductor device.

Figure 9:
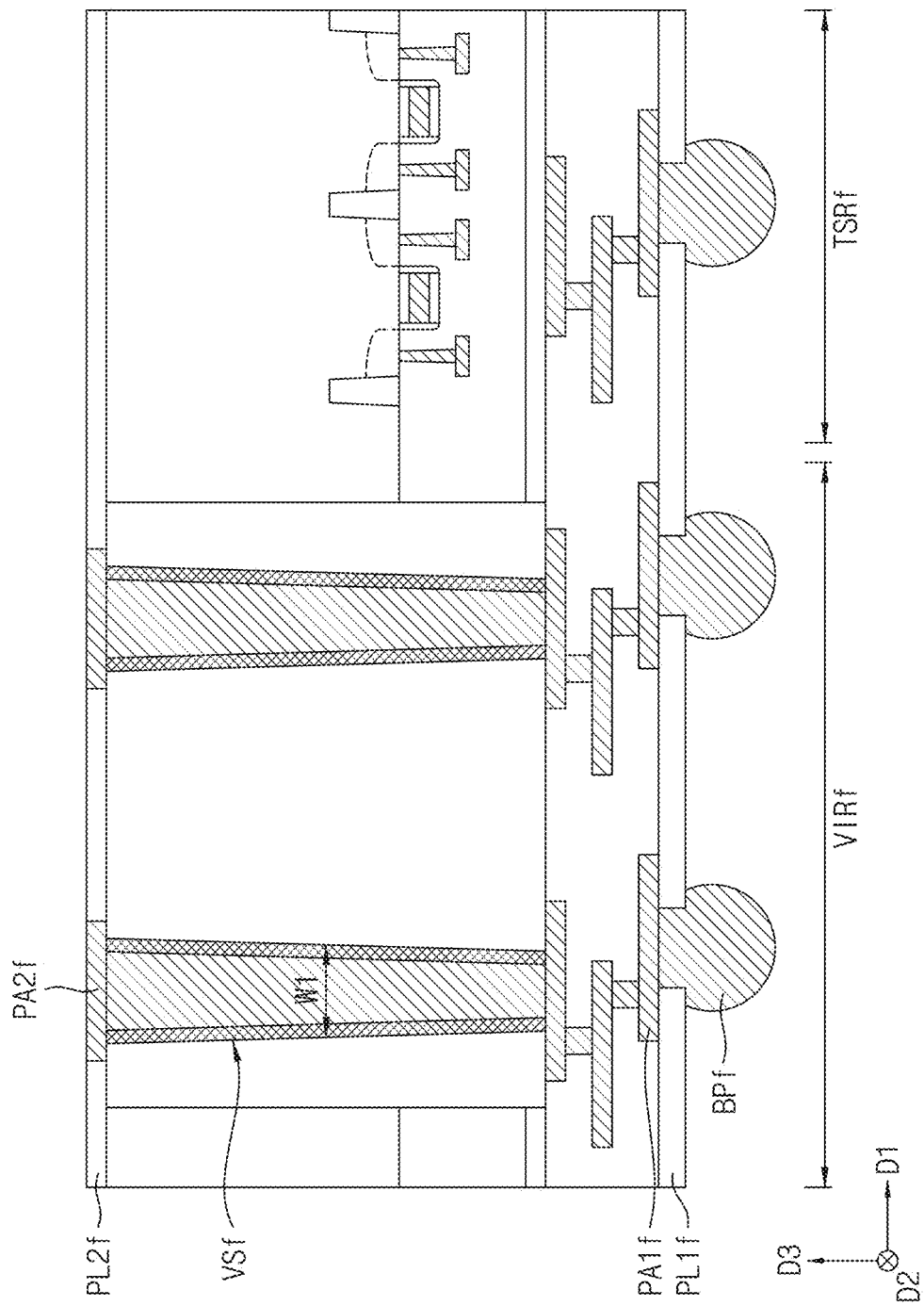
FIG. 9 is a cross-sectional view of a semiconductor device according to some example embodiments of the disclosure.

FIG. 9 is a cross-sectional view of a semiconductor device according to some example embodiments of the disclosure.

Referring to FIG. 9, the width of a via structure VSf may be gradually reduced as the via structure VSf extends toward a bump BPf, a first pad PA1f connected to the bump BPf, and a first protective film PL1f contacting the bump BPf and the first pad PA1f. For example, the width of the via structure VSf in a first direction D1 may be defined as a first width W1, and the first width W1 may be gradually reduced as the via structure VSf extends toward the bump BPf, the first pad PA1f, and the first protective film PL1f.

The width of the via structure VSf may be gradually reduced as the via structure VSf extends away from a second pad PA2f and a second protective film PL2f surrounding the second pad PA2f. The via structure VSf may have a tapered profile. For example, the first width W1 may be gradually reduced as the via structure VSf extends away from the second pad PA2f and the second protective film PL2f.

Figure 10A:
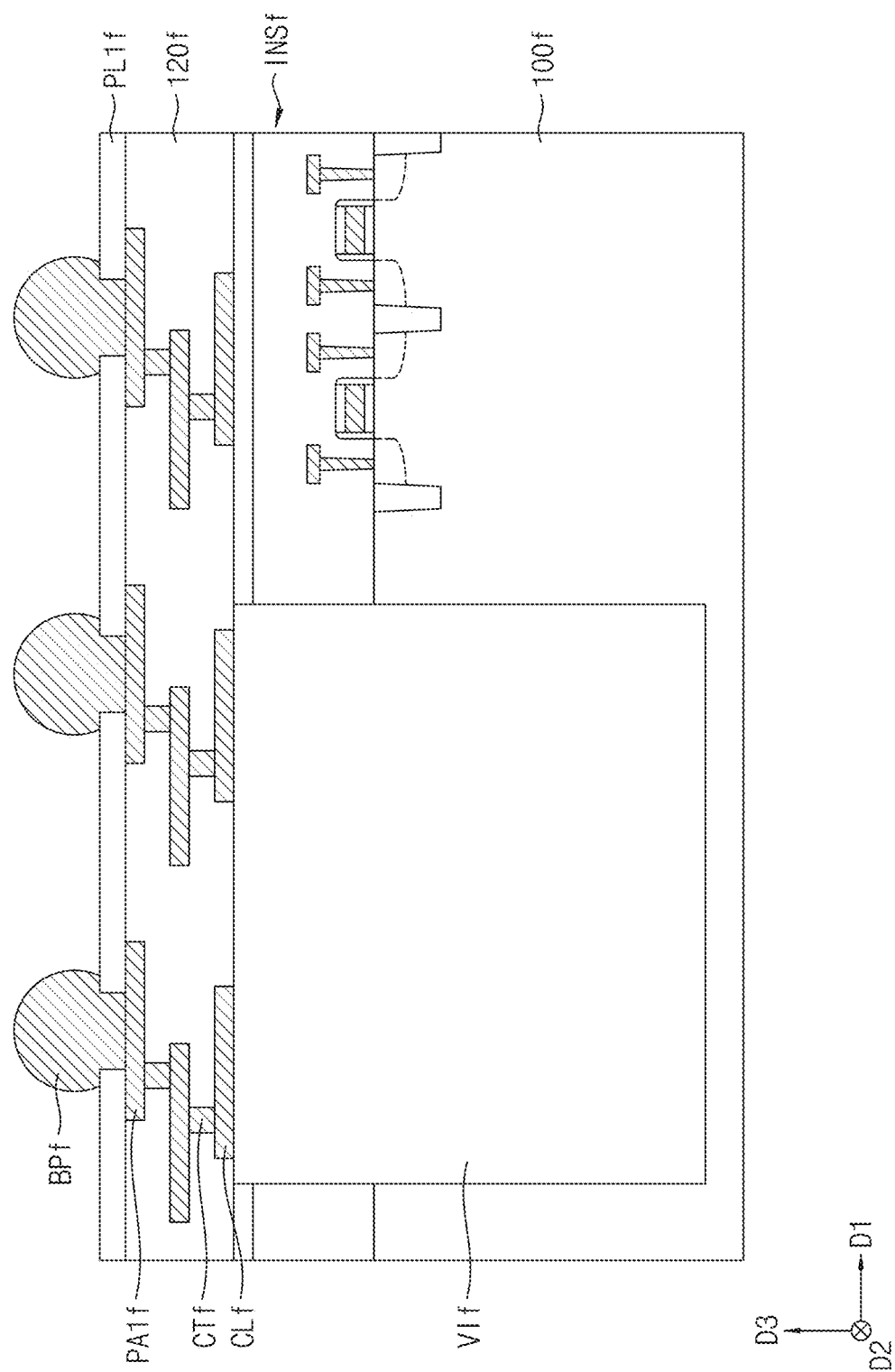
FIGS. 10A, 10B, and 10C are cross-sectional views explaining a method for manufacturing the semiconductor device according to FIG. 9.
Figure 10B:
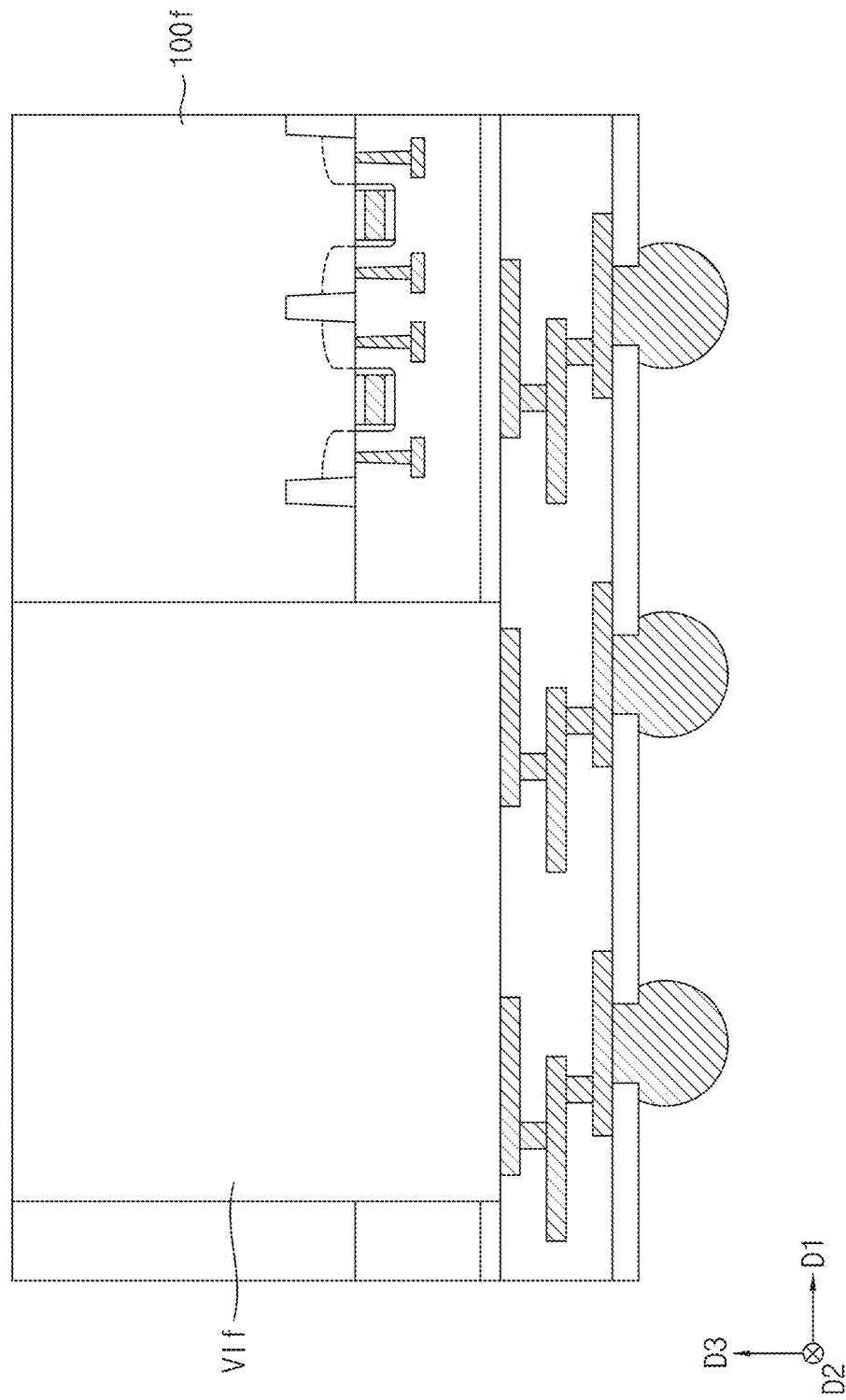
Figure 10C:
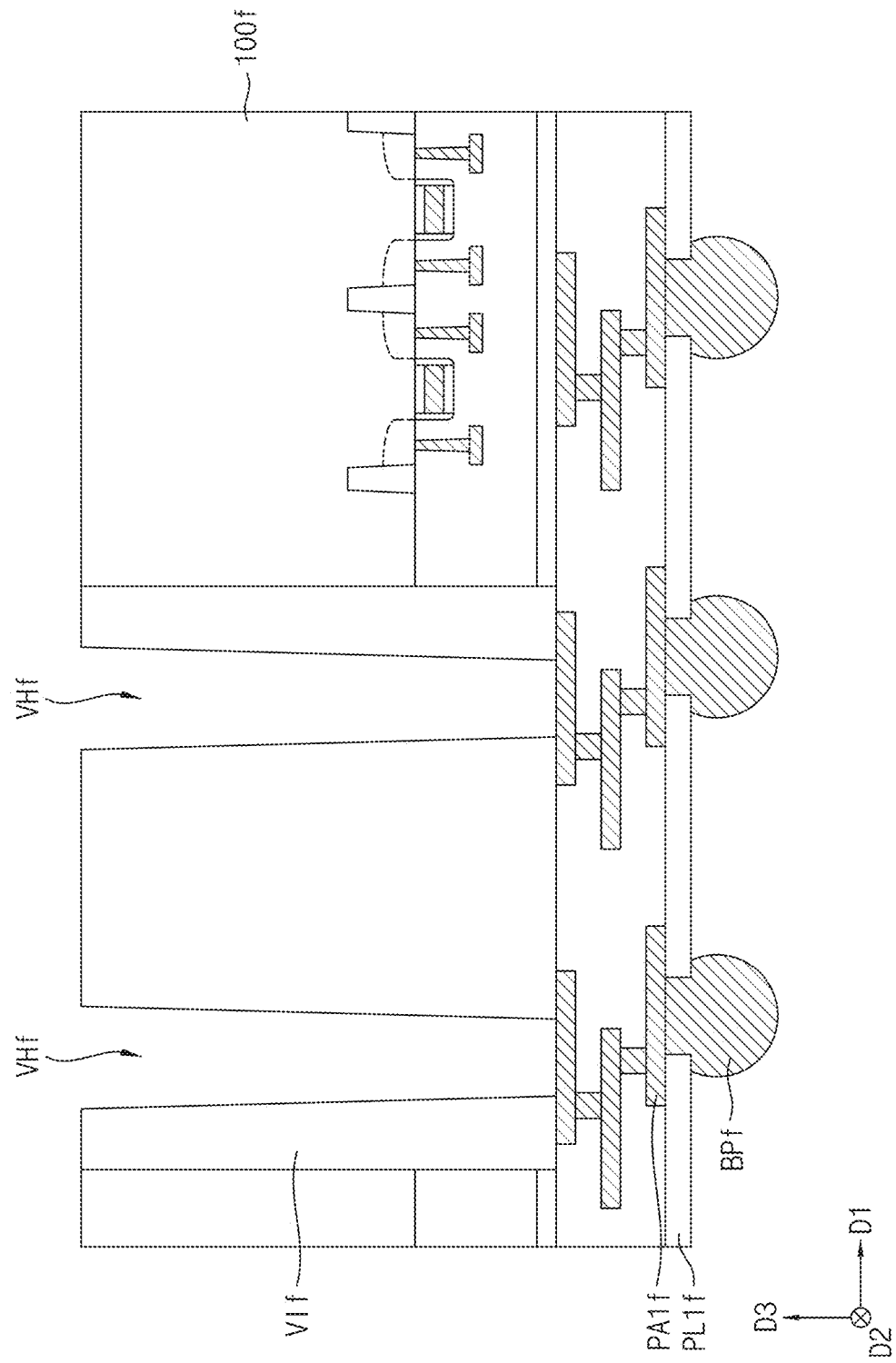

FIGS. 10A, 10B, and 10C are cross-sectional views explaining a method for manufacturing/fabricating the semiconductor device according to FIG. 9.

Referring to FIG. 10A, a via insulating layer VIf may be formed in a substrate 100f and an insulating structure INSf. Subsequently, an insulating layer 120f, and conductive lines CLf, contacts CTf and first pads PA1f in the insulating layer 120f may be formed on the via insulating layer VIf and the insulating structure INSf.

A first protective film PL1f and bumps BPf may be formed on the insulating layer 120f.

Referring to FIG. 10B, the substrate 100f may be inverted. Thereafter, a portion of the substrate 100f and a portion of the via insulating layer VIf may be removed, thereby exposing the via insulating layer VIf.

Referring to FIG. 10C, the exposed via insulating layer VIf may be etched, thereby forming via holes VHf. The width of the via hole VHf may be gradually reduced as the via hole VHf extends towards the bump BPf, the first pad PA1f and the first protective film PL1f.

Referring to FIG. 9, via structures VSf may be formed in the via holes VHf, respectively, and second pads PA2f and a second protective film PL2f may be formed.

Figure 11:
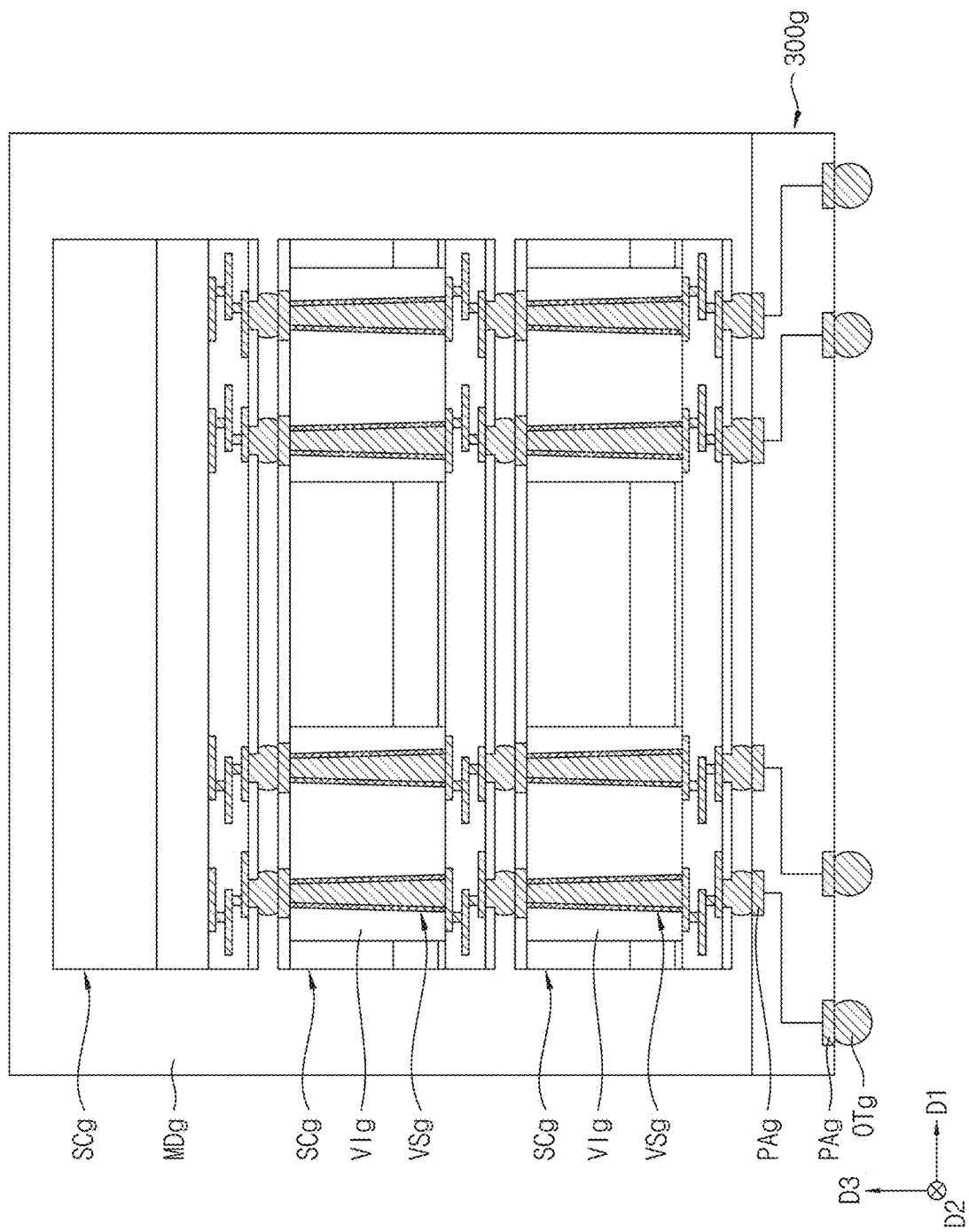
FIG. 11 is a cross-sectional view of a semiconductor device according to some example embodiments of the disclosure.

FIG. 11 is a cross-sectional view of a semiconductor device according to some example embodiments of the disclosure.

Referring to FIG. 11, the semiconductor device may include an interposer 300g, a plurality of semiconductor chips SCg, and a molding layer MDg. The interposer 300g may include outer terminals OTg and pads PAg.

The plurality of semiconductor chips SCg may be stacked on the interposer 300g in a third direction D3. For example, the plurality of semiconductor chips SCg may be vertically stacked on the interposer 300g. Each of the semiconductor chips SCg may include a transistor. At least one of the plurality of semiconductor chips SCg may include a via insulating layer VIg, and a via structure VSg extending through the via insulating layer VIg.

The molding layer MDg may surround the plurality of semiconductor chips SCg. The molding layer MDg may include a polymer material. For example, the molding layer MDg may include an epoxy resin.

Figure 12:
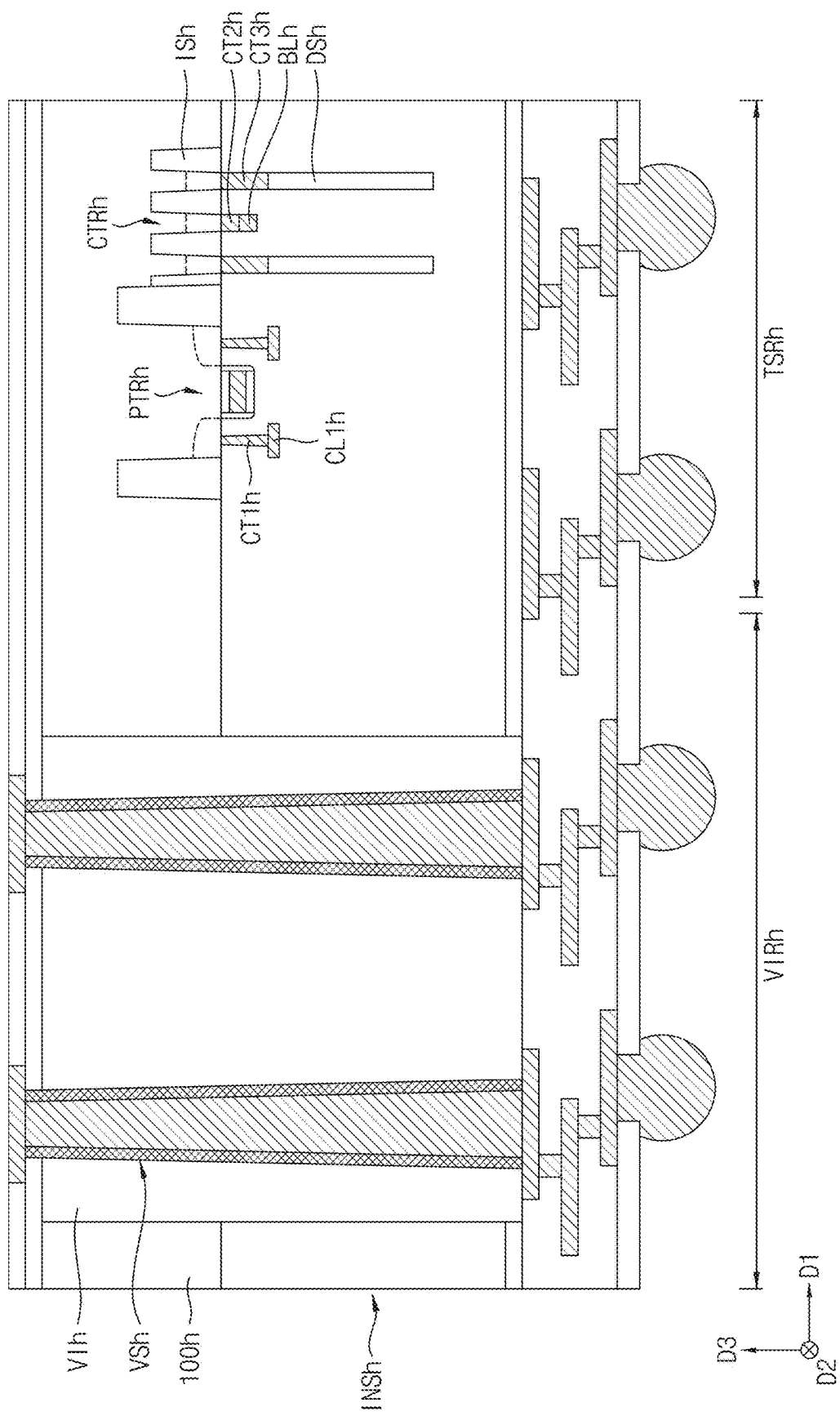
FIG. 12 is a cross-sectional view of a semiconductor device according to some example embodiments of the disclosure.

FIG. 12 is a cross-sectional view of a semiconductor device according to some example embodiments of the disclosure.

Referring to FIG. 12, the semiconductor device may include a peripheral transistor PTRh and a cell transistor CTRh between a substrate 100h and an insulating structure INSh. The peripheral transistor PTRh and the cell transistor CTRh may be disposed in a transistor region TSRh. The semiconductor device may include element isolation films ISh defining active regions of the peripheral transistor PTRh and the cell transistor CTRh, a first contact CT1h and a first conductive line CL1h, which are connected to the peripheral transistor PTRh, second and third contacts CT2h and CT3h, which are connected to the cell transistor CTRh, a bit line BLh connected to the second contact CT2h, and an information storage element DSh connected to the third contact CT3h. For example, the information storage element DSh may be a capacitor and/or a memristor.

A via insulating layer VIh extending through the substrate 100h and the insulating structure INSh may be provided, and via structures VSh extending through the via insulating layer VIh may be provided. The via insulating layer VIh and the via structures VSh may be disposed in a via region VIRh. The peripheral transistor PTRh and the cell transistor CTRh may not be disposed in the via region VIRh.

In the semiconductor device according to the example embodiments of the disclosure, via structures alone may be disposed in a via region without disposition of any transistor and, as such, transistors may be relatively densely disposed in a transistor region. Thus, the semiconductor device may have a relatively small size, and/or may have an improved yield and/or a reduction in cost to manufacture.

While various example embodiments of inventive concepts have been described with reference to the accompanying drawings, it should be understood by those of ordinary skill in the art that various modifications may be made without departing from the scope of the disclosure and without changing essential features thereof. Furthermore, example embodiments should not necessarily be construed as mutually exclusive. For example, some example embodiments may include features described with reference to one or more figures, and may also include other features described with reference to one or more other figures. Therefore, the above-described embodiments should be considered in a descriptive sense only and not for purposes of limitation.

What is claimed is:
1. A semiconductor device comprising:
a substrate;
an insulating structure covering the substrate;

a transistor between the substrate and the insulating structure;

a via insulating layer extending through the insulating structure and the substrate;

a plurality of via structures extending through the via insulating layer and surrounded by the via insulating layer;

a plurality of conductive structures respectively connected to the plurality of via structures; and a plurality of bumps respectively connected to the conductive structures, wherein an upper surface of the via insulating layer is arranged at a same level as an upper surface of the substrate.

2. The semiconductor device according to claim 1, wherein a bottom surface of the via insulating layer is coplanar with a bottom surface of the insulating structure.

3. The semiconductor device according to claim 1, wherein each of the plurality of via structures comprises a conductive layer and a barrier layer surrounding the conductive layer.

4. The semiconductor device according to claim 1, further comprising:

a first insulating layer covering the substrate, wherein top surfaces of the plurality of via structures are coplanar with a top surface of the first insulating layer.

5. The semiconductor device according to claim 1, wherein, the insulating structure comprises a second insulating layer covering the transistor, and a mask layer covering the second insulating layer, and bottom surfaces of the plurality of via structures are coplanar with a bottom surface of the mask layer.

* * * * *